(12) United States Patent
Nakamura et al.

(10) Patent No.: US 7,728,445 B2
(45) Date of Patent: Jun. 1, 2010

(54) SEMICONDUCTOR DEVICE PRODUCTION METHOD AND SEMICONDUCTOR DEVICE

(75) Inventors: Taketoshi Nakamura, Iwata (JP); Hiroshi Saitoh, Iwata (JP)

(73) Assignee: Yamaha Corporation, Shizuoka-Ken (JP)

( * ) Notice: Subject to any disclaimer, the term of this patent is extended or adjusted under 35 U.S.C. 154(b) by 583 days.

(21) Appl. No.: 11/375,212

(22) Filed: Mar. 15, 2006

(65) Prior Publication Data

US 2006/0244149 A1    Nov. 2, 2006

(30) Foreign Application Priority Data

Mar. 16, 2005    (JP) .......................... P2005-074902
May 18, 2005    (JP) .......................... P2005-145610

(51) Int. Cl.
*H01L 23/29*    (2006.01)
(52) U.S. Cl. ................... 257/790; 438/113; 438/114; 438/127; 257/E21.599
(58) Field of Classification Search ................. 438/113, 438/114, 127; 257/790, 791, E21.599
See application file for complete search history.

(56) References Cited

U.S. PATENT DOCUMENTS

| | | | |
|---|---|---|---|
| 6,282,781 B1 | 9/2001 | Gotoh et al. | |
| 6,491,857 B2 | 12/2002 | Ise | |
| 6,534,387 B1 * | 3/2003 | Shinogi et al. | 438/465 |
| 6,576,986 B2 | 6/2003 | Kobayakawa | |
| 6,627,981 B2 | 9/2003 | Shibata | |
| 6,641,382 B2 | 11/2003 | Mine | |
| 6,794,736 B1 | 9/2004 | Kobayakawa | |
| 6,856,017 B2 | 2/2005 | Yoneda et al. | |
| 2001/0018229 A1 * | 8/2001 | Kato et al. | 438/106 |
| 2001/0042902 A1 * | 11/2001 | Wakabayashi et al. | 257/620 |
| 2002/0127776 A1 * | 9/2002 | Nakajo et al. | 438/110 |
| 2002/0140114 A1 | 10/2002 | Matsumoto | |
| 2003/0006492 A1 | 1/2003 | Ogasawara et al. | |
| 2004/0164385 A1 | 8/2004 | Kado et al. | |

FOREIGN PATENT DOCUMENTS

| | | |
|---|---|---|
| JP | 02-125412 | 5/1990 |
| JP | 2006-120295 | 4/1994 |
| JP | 2000-243728 | 9/2000 |
| JP | 2001-035972 | 2/2001 |
| JP | 2001-060591 | 3/2001 |

(Continued)

*Primary Examiner*—Trung Dang
(74) *Attorney, Agent, or Firm*—Dickstein Shapiro LLP

(57) ABSTRACT

A semiconductor device production method which includes steps of: preparing a wafer on which multiple integrated circuits are formed on a principal face; forming a rewiring which is electrically connected to the integrated circuits via a pad electrode; and dicing the wafer after forming an electrode terminal on the rewiring, including steps of: forming a first resin layer by sealing at least the rewiring and the electrode terminal formed on the principal face of the wafer with a first resin; processing a first dicing from a back face of the wafer to the principal face of the wafer or halfway to the first resin layer when the first resin layer is formed; forming a second resin layer by sealing a cut line outlined upon the first dicing and the back face of the wafer continuously with a first resin; and processing a second dicing while leaving the second resin layer which covers a side face outlined upon the first dicing.

10 Claims, 16 Drawing Sheets

FOREIGN PATENT DOCUMENTS

| | | |
|---|---|---|
| JP | 2001-144121 | 5/2001 |
| JP | 2001-274182 | 10/2001 |
| JP | 2002-313991 | 10/2002 |
| JP | 2003-309228 | 10/2003 |
| JP | 2005-175327 | 6/2005 |
| JP | 2006-196701 | 7/2006 |
| JP | 2006-229113 | 8/2006 |
| JP | 4103896 | 9/2006 |
| TW | 531865 | 5/2003 |
| TW | 550776 | 9/2003 |
| TW | 586201 | 5/2006 |
| WO | WO 2003/032387 | 2/2005 |

* cited by examiner

SEMICONDUCTOR DEVICE PRODUCTION METHOD AND SEMICONDUCTOR DEVICE

BACKGROUND OF THE INVENTION

1. Field of the Invention

The present invention relates to a nonconductor production method in which packaging is processed at a wafer level and dicing is processed at the final phase, and a semiconductor device.

Priority is claimed on Japanese Patent Application No. 2005-074902, filed Mar. 16, 2005, and Japanese Patent Application No. 2005-145610, filed May 18, 2005, the contents of which are incorporated herein by reference.

2. Description of the Related Art

In recent years, in accordance with, for example, the requirements for both an increasing number of functions and an increase in performance of devices such as mobile terminals, semiconductor devices applied to these devices are required to be small and thin, and to process faster. A semiconductor device known as a so called WL-CSP (Wafer Level Chip Size Package) is getting attention because it is appropriate for such requirements. The WL-CSP is produced in a manner such that forming of rewiring, forming of electrode terminals and resin molding (packaging) in order to protect mainly an IC (Integrated Circuit) formed on the principal surface of the wafer from heat, light, physical shocks and so on, are processed at a wafer level, and at the final phase, dicing is processed. Because of such a production process, it is possible to make the site of the semiconductor device after packaging almost as small as an IC chip and it is believed that it is possible to design in even smaller sizes.

However, conventional WL-CSPs (semiconductor devices) are divided into each semiconductor device by cutting (dicing) the wafer at the final phase, therefore, the cut surface of the side face of substrates is exposed even though a principal surface of the substrates of the semiconductor devices (diced wafer) is resin molded. There is a problem in that the exposed side face is easily damaged due to physical shocks during the production steps. Moreover moisture can infiltrate between principal surface of the substrate and a resin layer, and the rewiring and electrode terminals may be oxidized and corroded in some cases.

Due to such a problem, there are semiconductor devices which are produced in a manner such that not only the principal face of the substrates but also the side face of the substrates or the side face and back of the substrates are resin-molded. Such semiconductor devices in which external faces are resin-molded, are reinforced to avoid damage to the substrates, moreover, there is a benefit in that a repairing process of a damaged area can be omitted because, for example, the defective area generated on the substrates upon dicing due to chipping can be covered.

Generally, a processing of a semiconductor device A shown in FIG. 11 in which a side face 1a and a back face 1b of a substrate 1 are covered with resin layers 2 and 3, is shown in FIG. 12. First the wafer 1 is prepared on which multiple ICs 4 are formed on a principal face 1c, a rewiring 6 which is connected electrically to the ICs 4 via a pad electrode 5 is formed, and a metal post 7 which is made from copper and is columnar is formed on the rewiring 6.

As shown in FIG. 13, after fixing a resin plate 9 (a second resin layer 3) on which a dicing tape 8 made from an elastic material is attached, on the back face 1b of the wafer 1, a first dicing is processed from the principal face 1c of the substrate 1 in an orthogonal direction to the principal face 1c. In this first dicing, a dicing depth T1 is adapted to be halfway along a thickness direction of the dicing tape 8. A cut line 10 formed in the first dicing and the principal face 1c of the wafer 1 are sealed with a resin. This first resin is a first resin layer 2 which is molded to be as thick as embedding a metal post 7 that is formed on the principal face 1c of the wafer 1.

Moreover, as shown in FIG. 14, a surface 2a of the first resin layer 2 is polished to expose an upper face 7a of the columnar metal post 7, and a bump 11 which is a bump electrode and is an entrance for electricity and signals is attached to this exposed upper face 7a. An approximately central area in a width direction of the cut line 10 which is outlined in the first dicing and in which the first resin is filled is diced again (a second dicing) from the surface 2a of the first resin layer. In this process, the second dicing is processed in a manner such that the first in layer 2 is left to cover a side face 1a cut face) of the substrate 1 (diced wafer) which is outlined in the first dicing. A dicing depth T2 of the second dicing is approximately as deep as making a slight cut line from the surface 2a of the first resin layer 2. The semiconductor device A is diced in accordance with such process.

Finally, production of the semiconductor device A shown in FIG. 11 is completed after removing the dicing tape 8. This semiconductor device A has excellent shock resistance due to that not only the principal face 1a, but also the side face, 1a and the back side 1b are covered with the first resin layer 2 and resin plate 9 (the second resin layer 3).

However, in the above described production method, there is a problem such that spread particles due to dicing adhere to the rewiring or the metal post because the rewiring or the metal post is exposed upon the first dicing. If particles adhere to the rewiring or the metal post then there can be problems such that short circuits may occur, and the rewiring and the like are oxidized and corroded due to infiltration of moisture from a boundary between the substrate and the first resin layer because of the lower adhesiveness of the first resin layer.

On the other hand, in the above production method of the semiconductor device, the wafer is maintained by the dicing tape which is adhered upon the first dicing. This dicing tape is an elastic body, therefore, the cut line may be curved easily because the wafer slides upon dicing, and therefore, there is a problem in that the precision of size of the semiconductor device may be lowered after dicing.

There is a solution to this problem in that by attaching, for example, a metal plate instead of the dicing tape, the wafer is maintained harder and dicing is processed. However, such a method of attaching a metal plate has a problem in that production costs are increased since it requires time or extra processing steps to attach the metal plate and to detach the semiconductor device.

Moreover, in the above described production method of the semiconductor device, the resin layer which covers the side face of the substrate is the first resin layer which is molded continuously with the principal face of the substrate. In recent years, in accordance with requirements for tinner semiconductor devices, a production step of polishing the back side of the substrate in order to make the semiconductor device as thin as possible has been performed. In such a production step, for example, a discal polishing member is spun while moving it towards the back side of the substrate, therefore, at edges of the first resin layer covering the side face of the substrate a force in the direction of removal of the first resin layer may be caused. Due to such a phenomena, there are some cases in which the first resin layer covering the side face is removed because of polishing. Moreover, there is a problem such that removal occurs at the principal face in accordance with removal at the side face because the first resin layer of the side face is molded continuously with the first resin layer of the principal face. In this case, another problem is caused in which the IC or the rewiring formed on the principal face of the substrate are damaged when the resin layer of the principal face is removed.

Regarding the above described problems, the present invention aims to provide a production method of a semiconductor device and a semiconductor device which can be harder without causing electrical short or removal of a resin layer.

Moreover, in the above described production method for the semiconductor device, the first resin layer and the second resin layer that cover the side face and the back face of the substrate, are fixed at the side face and at the back face respectively, therefore, there is a problem such that peeling can easily occur because of, for example, vibration upon dicing.

The first resin layer covers both the side face and the principal face of the substrate, therefore, when the first resin layer covering the side of the side face is peeled, it causes peeling of the first resin layer on the principal surface, therefore, there is a problem in that the IC, the rewiring and the like formed on the principal surface become damaged.

Regarding the above described problems, the present invention aims to provide a production method for a semiconductor device tat does not cause peeling of the resin layer and achieves a reliably strong substrate (a diced wafer) and a semiconductor device.

SUMMARY OF THE INVENTION

Regarding the above described problems, the present invention aims to provide a production method for a semiconductor device that does not cause peeling of the resin layer and achieves a reliably strong substrate (a diced wafer) and a semiconductor device.

A first aspect of the present invention is a semiconductor device production method including the steps of: preparing a wafer on which multiple integrated circuits are formed on a principal face; forming a rewiring which is electrically connected to the integrated circuits via a pad electrode; forming an electrode terminal on the rewiring; forming a first resin layer by sealing at least the rewiring and the electrode terminal formed on the principal face of the wafer with a first resin; processing a first dicing from a side of a back face of the wafer to the principal face of the wafer or halfway to the first resin layer when the first resin layer is formed; forming a second resin layer by sealing a cut line outlined upon the first dicing and the back face of the wafer continuously with a second resin; and processing a second dicing while leaving the second resin layer which covers a side face outlined upon the first dicing.

A second aspect of the present invention is the semiconductor device production method described above, further including the step of: polishing the second resin layer which seals the back face of the wafer in order to expose the wafer.

A third aspect of the present invention is a semiconductor device including: a substrate including an integrated circuit on a principal face; a rewiring electrically connected to the integrated circuit via an electrode pad; an electrode terminal formed on the rewiring; a first resin layer which has a thickness from the principal face of the substrate to an upper surface of the electrode terminal and which seals a side of the principal face of the substrate; a bump electrode mounted on the upper surface of the electrode terminal which is exposed on an upper surface of the first resin layer; and a second resin layer which covers continuously a back face of the substrate and a side face in an orthogonal direction to the back face.

A fourth aspect of the present invention is the semiconductor device described above, wherein: an edge of the second resin layer on the principal face of the substrate is set to be closer to a surface of the first resin layer than the principal face of the substrate and adhered closely to the first resin layer.

A fifth aspect of the present invention is a semiconductor device including: a substrate including an integrated circuit on a principal face; a rewiring electrically connected to the integrated circuit via an electrode pad; an electrode terminal formed on the rewiring; a first resin layer which has a thickness from the principal face of the substrate to an upper surface of the electrode and which seals a side of the principal face of the substrate; a bump electrode mounted on the upper surface of the electrode terminal which is exposed on an upper surface of the first resin layer; and a second resin layer which covers a side face of the substrate.

A sixth aspect of the present invention is a semiconductor device production method including the steps of: preparing a wafer on which multiple integrated circuits are formed on a principal face; forming a rewiring which is electrically connected to the integrated circuits via a pad electrode; for an electrode terminal on the rewiring; forming a first resin layer; forming a dicing cut line by processing a first dicing from a back face of the wafer to the principal face of the wafer or halfway to the first resin layer when the first resin layer is formed; forming a slit portion whose cross section is in a concave shape and that extends in a direction from the back face to the principal face and that has a depth smaller than a depth of the dicing cut line which extends in a direction from the back face to the principal face; forming a second resin layer by sealing a cut line outlined upon the first dicing and the back face of the wafer continuously with a second resin; and processing a second dicing while leaving the second resin layer which covers a side face outlined upon the first dicing.

A seventh aspect of the present invention is a semiconductor device production method including the steps of: preparing a wafer on which multiple integrated circuits are formed on a principal face; forming a rewiring which is electrically connected to the integrated circuits via a pad electrode; sealing at least the rewiring and the electrode terminal formed on the principal face of the wafer in an embedded state with a first resin after forming an electrode terminal on the rewiring; forming the first resin layer while polishing the first resin in order to expose the electrode terminal; mounting a bump electrode on the electrode terminal which is exposed in order to connect the semiconductor device to outside; and dicing the wafer, including the steps of: forming a dicing cut line by processing a first dicing from a back face of the wafer to the principal face of the wafer or halfway to the first resin layer when the rewiring and the electrode terminal are sealed with the first resin, when the first resin layer is formed, or when the bump electrode is mounted on the electrode terminal; forming a slit portion whose cross section is in a concave shape and that extends in a direction from the back face to the principal face and that has a depth smaller than a depth of the dicing cut line which extends in a direction from the back face to the principal face; forming a second resin layer by sealing a cut line outlined upon the first dicing and the back face of the wafer continuously with a second resin; and processing a second dicing while leaving the second resin layer which covers a side face outlined upon the first dicing.

An eighth aspect of the present invention is the semiconductor device production method described above, wherein: the first dicing is operated in a manner in which the dicing cut line is extended in a linear shape while seen in a plane facing the back face; and upon forming the second resin layer, the second resin is printed in a direction crossing a direction in which the dicing cut line is extended.

A ninth aspect of the present invention ishe semiconductor device production method described above, wherein: the second resin is printed in a direction crossing an extending direction of the dicing cut line at an angle from 15 degrees to 75 degrees.

A tenth aspect of the present invention is the semiconductor device production method described above, wherein: the second resin layer is polished while the second resin layer is left on the back face of the wafer in a state of sealing the back face of the wafer.

An eleventh aspect of the present invention is the semiconductor device production method described above, further including a step of adhering a metal plate after forming the second resin layer and before the second dicing.

A twelfth aspect of the present invention is the semiconductor device production method described above, further including a step of roughening both or one of the principle surface of the wafer and surface of the first resin layer after the first dicing.

A thirteenth aspect of the present invention is a semiconductor device, including: an integrated circuit on a principal face of a substrate; a rewiring electrically connected to the integrated circuit via a pad electrode; a first resin layer which has a thickness from the principal face of the substrate to an upper surface of the electrode terminal and which seals a side of the principal face of the substrate; and a bump electrode mounted on the upper surface of the electrode terminal which is exposed on upper surface of the first resin layer, wherein: a slit portion is formed on a back face of the substrate and whose cross section is in a concave shape and that extends in a direction from the back face to the principal face; and a second resin layer is formed to cover the back face and the side face crossing the back face continuously while being filled in the slit portion.

By applying the production method of the semiconductor device of the present invention, it can be possible to prevent particles from a adhering because the rewiring and the electrode terminals (metal posts) are already molded with the first resin layer at the first dicing. Therefore, there is no possibility of electrical short circuits being caused or reduced adhesiveness of the first resin layer due to adhering particles.

In the first dicing, the dicing depth is adapted to be halfway from the back side of the wafer to the principal face of the wafer or to the first resin layer, therefore, it is possible to process the dicing in such a state that the wafer is kept hard enough with the first resin layer. It is possible to process the dicing without curving the cut line, therefore, it is possible to ensure the dimensional accuracy of the semiconductor device.

Moreover, by applying the production method of the semiconductor device of the present invention, upon polishing the second resin layer sealing the back side of the substrate in order to expose the wafer, it is possible to polish in such a state that the cut line outlined in the first dicing is filled with the second resin layer. Therefore, it is possible to polish without separating the side face of the substrate and the second resin layer, and it is possible to design a thinner semiconductor device preferably.

Moreover, the second resin layer is the resin layer which covers the side face and the back side of the substrate continuously, therefore, it is possible to position the edge of the second resin layer cove the side face of the substrate at the side of the principal face of the substrate. At a step in which the semiconductor devices that are diced are obtained, even in a case of, for example, polishing the second resin layer molded on the back side of the substrate, it is possible to design a thinner semiconductor device without causing a force in a direction of removal from the side face to the second resin layer covering the side face of the substrate.

By applying the semiconductor production apparatus of the present invention, it is possible to prevent removal of the first resin layer even when the second resin layer is removed because the second resin layer which covers the side face of the substrate is not formed continuously with the first resin layer which covers the principal face of the substrate. Therefore, it is possible to prevent damage to the IC or the rewirings.

The edge of the second resin layer on the principal face of the substrate is closer to the surface of the first resin layer than the principal face of the substrate and is adhered closely to the first resin layer, therefore, it is possible to prevent infiltration of moisture from a boundary between the first resin layer and the second resin layer Moreover, in this case, the upper face of the edge of the second resin layer is adhered closely to the first resin layer, therefore, if the second resin layer is removed from the side face of the substrate, it is possible to solve the problem of the first resin layer being removed.

By applying the semiconductor device, it is possible to provide a thinner semiconductor device because the second resin layer which covers the substrate s formed on the side face of the substrate.

In accordance wit the semiconductor device production method of the present invention, the slit portion is formed on the back face of the wafer, and the second resin is formed to cover the back face of the wafer and the side face outlined upon the first dicing integrally while filling this slit portion, therefore, it is possible to gain an adhesion area between the second resin layer and the back face because of the slit portion and to gain resistance for modifications of the second resin layer because the slit portion and the resin portion filled with it are engaged, therefore, it is possible to reduce the possibility of removal of the second resin layer.

If the second resin layer is removed, it is possible to prevent occasion of removal of the first resin layer because the second resin layer and the first resin layer are not formed continuously. Therefore, it is possible to prevent damage to the IC, the rewiring and the like.

In accordance with the semiconductor device production method of the present invention, because the second resin is printed in a direction crossing the extending direction of the dicing cut line, it is possible to reduce the flow resistance at a lower level upon filling the dicing cut line and the slit portion with the second resin, and they are filled in a state of flowing by extrusion, therefore, the second resin filling the dicing cut line and the slit portion does not include air inside. That is, it is possible to fill the dicing cut line and the slit portion with the second resin in a dense and thick state, and it is possible to make the adhesiveness of the second resin layer accurate, therefore it is possible to reliably strengthen the semiconductor device. By printing the second resin in a direction crossing the extending direction of the dicing cut line at an angle from 15 degrees to 75 degrees, it is possible to obtain the above described advantages more reliably.

In accordance with the semiconductor device production method of the present invention, by polishing a part of the second resin layer on the back face of the wafer, it is possible to achieve a thinner semiconductor device while maintaining strength with the first resin layer and the second resin layer.

In accordance with the semiconductor device production method of the present invention, because the second resin layer is formed so as to cover the back face and the side face of the substrate integrally while being filled in the slit portion, it is possible to have larger adhesion area between the second resin layer and the substrate because of the slit portion and to have a larger resistance for modifications of the second resin layer because of the slit portion, therefore, it is possible to prevent removal of the second resin layer. If the second resin layer is removed, it is possible to prevent removal of the first resin layer because the second resin layer covering the side face of the substrate and the first resin layer covering the principal ace of the substrate are not formed continuously, therefore, it is possible to prevent damage to the IC, the rewiring and the like. Therefore, it is possible to provide a semiconductor device with excellent shock resistance and high reliability.

DETAILED DESCRIPTION OF THE INVENTION

Hereinafter, referring to figures, a semiconductor device B and its production method according to a first embodiment of the present invention are explained. The semiconductor device B described in this embodiment is mounted and used in devices such as, for example, a mobile terminal apparatus, and especially, is related to WL-CSP to which a wafer level rewiring and resin moldings are processed.

Figure 1:
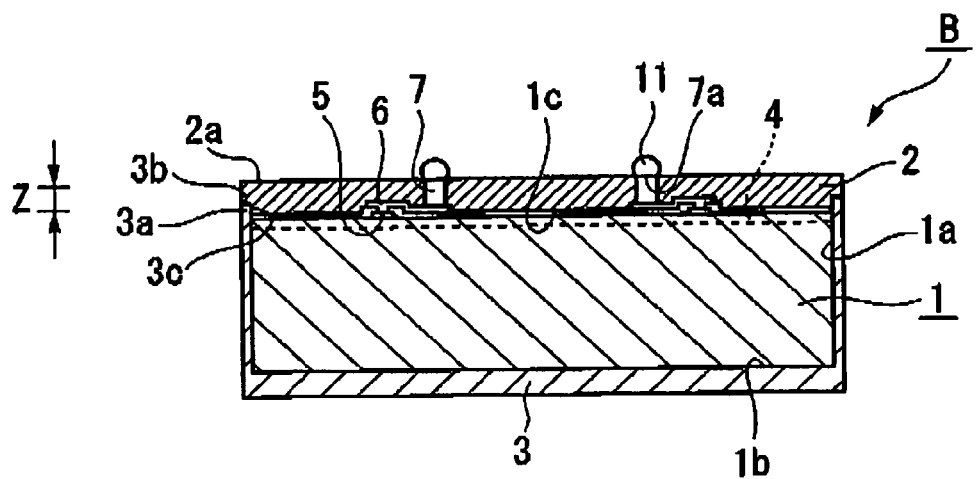
FIG. 1 is a cross-sectional view of the semiconductor device according to a first embodiment of the present invention.

As shown in FIG. 1, the semiconductor device B in accordance with the present invention includes a substrate 1 (a diced wafer) which is a laminate and which has an integrated circuit 4 on a principal face 1c, a rewiring 6 which is electrically connected to the integrated circuit 4 via a pad electrode 5, a columnar electrode terminal (metal post) 7 which is formed on the rewiring 6, a first resin layer 2 which has a thickness from the principal face 1c of the substrate 1 to an upper face 7a of the electrode terminal 7 and which seals the principal face 1c of the substrate 1, and a bump electrode 11 (a bump) which is mounted on the upper surface 7a of the electrode terminal 7 that is exposed on a surface 2a of the first resin layer 2. On a side face 1a and aback face 1b of the substrate 1, a second resin layer 3 is formed to cover each of them continuously. Moreover, an edge 3a of this second resin layer 3 at the side of the principal face 1c is positioned in a range of a thickness Z of the first resin layer, and an edge face 3b and a side face at the side of the substrate 1 are closely adhered to the first resin layer 2.

The first resin layer 2 and the second resin layer 3 are made from, for example, epoxy resin, and the bump 11 is coated with, for example, gold or solder.

In the following, referring to FIG. 1 to FIG. 6, a production process of the semiconductor device B which has a structure described above is explained.

Figure 2:
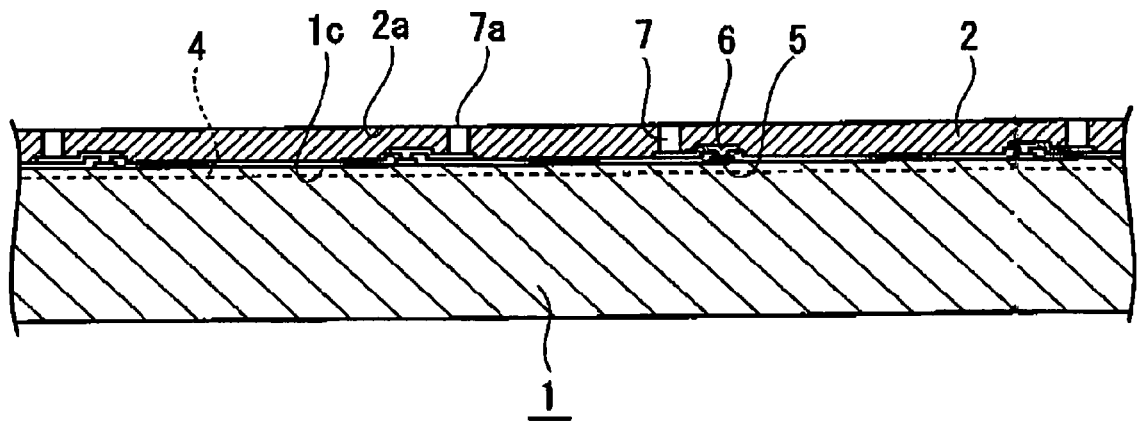
FIG. 2 shows a state of a wafer on which a rewiring and the like are formed and a first resin layer is formed in a semiconductor device production process showing FIG. 1.

First, as shown in FIG. 2, the wafer 1 which is in a rectangular shape is prepared, on which the integrated circuit 4 is formed on the principal face 1c, at the rewiring 6 which is connected to the pad electrode 5 and the columnar metal post 7 on the rewiring 6 are formed. By sealing the rewiring 6 and the columnar metal post 7 with the first resin, the first resin layer 2 is formed. Moreover, the first resin layer 2 is formed in a manner such that the upper face 7a of the columnar metal post 7 is embedded, and the surface 2a of the first resin layer 2 is polished later, therefore, the upper surface of the columnar metal post 7 is exposed on the surface 2a of the first resin layer 2.

Figure 3:
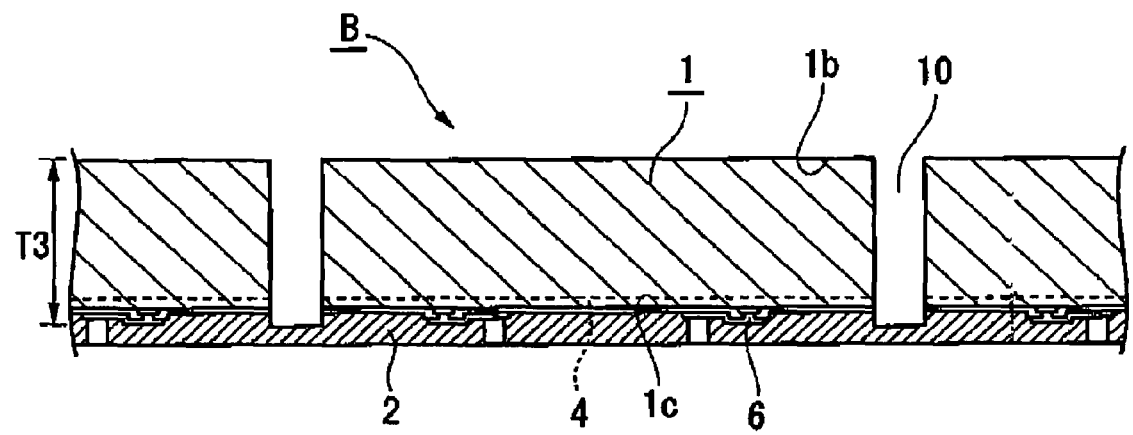
FIG. 3 shows a state of the semiconductor device production process of FIG. 1 in which a first dicing is processed.

As shown in FIG. 3, after turning over the wafer 1, from the back face. 1b, a first dicing is processed using, for example, a thin-bladed grindstone (whetstone) which is selected in order to fit the size of the semiconductor device B. In this process, a dicing depth T3 is determined to be halfway from the back face 1b of the wafer 1 to the first resin layer 2, and a cut line 10 is outlined in this first dicing. When the first dicing is finished, the wafer 1 which has the integrated circuit 4 and the rewiring 6 on the principal face 1c, keeps enough thickness for maintaining strength and it is one unit, that is, it is not yet diced. Therefore, it is possible to dice without slicing the wafer 1 upon the first dicing, and it can be expected to have no curving of the cut line.

Figure 4:
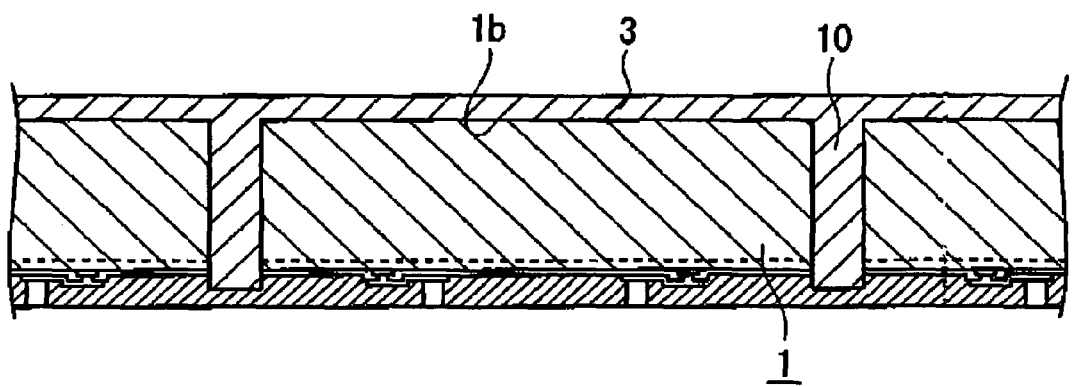
FIG. 4 shows a state of the semiconductor device production process of FIG. 1 in which sealing is processed with a second resin layer.

As shown in FIG. 4, the second resin layer 3 is formed by filling the cut line that is outlined with the second resin and sealing the back face b1 of the wafer with the second resin layer 3.

Figure 5:
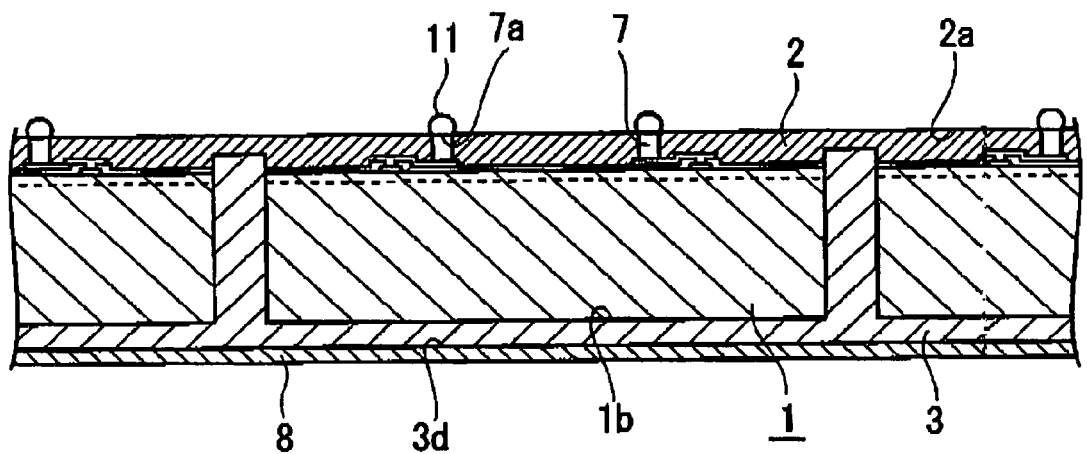
FIG. 5 shows a state of the semiconductor device production process of FIG. 1 in which a bump electrode is set and a dicing tape is adhered.

When the second resin is cured, after turning over the wafer 1 again, as shown in FIG. 5, by polishing the surface 2a side of the first resin layer 2, the upper face 7a of the columnar metal post 7 is formed so as to be exposed on the surface 2a of the first resin layer 2, the bump 11 is mounted on the upper surface 7a of the columnar metal post 7 which is positioned on the same one surface as the surface 2a, and a dicing tape 8 is adhered on an external face 3d of the second resin layer 3 which seals the back face 1b of the wafer 1.

Figure 6:
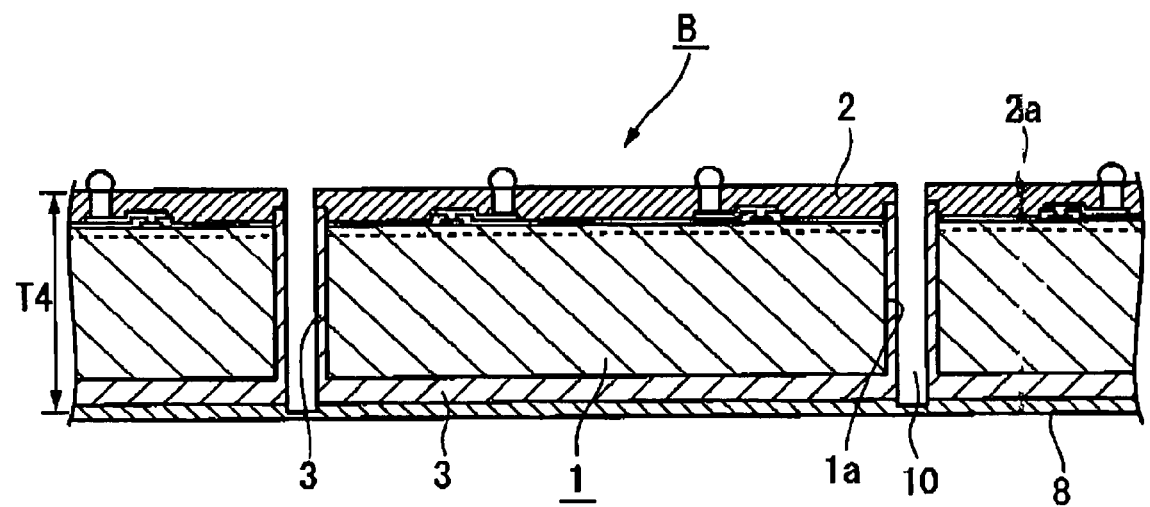
FIG. 6 shows a state of the semiconductor device production process of FIG. 1 in which a second dicing is processed.

As shown in FIG. 6, alter preparing a thin-bladed grindstone which is thinner than the thin-bladed grindstone used for outlining the cut line 10, a second dicing is processed at the center of the width direction of the cut line 10 on the surface 2a of the first resin layer 2 leaving the second resin layer 3 covering a cut surface of the first dicing. In this process, a dicing depth T4 is adjusted to be halfway from the surface 2a of the first resin layer 2 to the dicing tape 8, and the semiconductor device B is diced in this phase. Upon the second dicing, a lower pressure is applied for dicing the resin in the first resin layer and the second resin layer. Therefore, there is no curving of the cut line when dicing is processed in a state in which the wafer 1 is supported by the dicing tape 8.

Finally, the dicing tape 8 is pulled so as to stretch it, and the semiconductor device B which is in a state of sticking to the dicing tape 8 and diced is removed. Thus, the production process of the semiconductor device B shown in FIG. 1 is finished.

In the production method of the semiconductor device B, upon the first dicing, the rewiring 6, the columnar metal post 7 and the like are already resin-molded and the first resin layer 2 is formed, therefore, it is possible to process dicing without adherence of particles generated on dicing to the rewiring 6 or the columnar metal post 7. Therefore, it is possible to prevent electrical short or lower adherence of the first resin layer 2.

Moreover, the first dicing which is processed from the back face 1b of the wafer 1 is performed halfway in the first resin layer 2, therefore, it is possible to dice without slicing the wafer 1. Therefore, it is possible to prevent occasion of curving of the cut line and the like, and it is possible to keep the precision of size of the semiconductor device B. Moreover, the second dicing is dicing of the resin of the first resin 2 and the second resin layer 3, therefore, it is possible to dice without causing curving of the cut line in a state in which the wafer 1 is supported by the dicing tape 8.

In accordance with the above described semiconductor device B, the second resin layer 3 which covers the side face 1a and the back face 1b of the substrate 1 is formed continuously, however, the second resin layer 3 which covers the side face 1a and the first resin layer 2 which covers the principal face 1c are not formed continuously, therefore, even if removal of the second resin layer 3 which covers the side face 1a occurs, it is possible to avoid removal of the first resin layer 2.

The edge 3a of the second resin layer 3 adhered closely to the first resin layer 2 is positioned in the range of the thickness Z of the first resin layer 2 that is closer to the surface 2a of the first resin layer 2 than the principal face 1c of the substrate 1, and the edge face 3b of the edge 3a of the second resin layer 3 and the side face 3c of the substrate 1 are adhered closely, therefore, it is possible to prevent infiltration of moisture from a boundary and it is possible to avoid removal of the first resin layer 2 even if removal of the second resin layer 3 which covers the side face 1a occurs.

Therefore, regarding the above described production method of the semiconductor device B and the semiconductor device B, it is possible to provide the semiconductor device B with high reliability because it is possible to achieve more strength in the substrate 1 while preventing damage to the integrated circuit 4 and the rewiring 6.

While the first embodiment of the present invention has been described and illustrated above, it should be understood that these are not to be considered as limiting. Additions, omissions, substitutions, and other modifications can be made without departing from the spirit or scope of the present invention. For example, in the first embodiment, the second resin layer 3 is described as the epoxy resin that is the same as the resin of the first resin layer 2, however, the resin of these two layers can have different characteristics such as, for example, different filler content, or can be a different resin from the epoxy resin. In the explanation, the dicing depth T3 of the first dicing was described as the halfway of the first resin layer 2, however, the dicing depth T3 of the first dicing can reach the principal face 1c of the wafer 1 and in this case, the edge 3a of the second resin layer 3 adhered closely to the first resin layer 2 is adhered to the first resin layer 2 only with the edge face 3b.

Regarding the semiconductor device B produced in accordance with the first embodiment, it is possible to achieve a thinner semiconductor device B by polishing the second resin layer 3 formed on the back face 1b of the substrate 1 or both the second resin layer 3 and the substrate 1. In this process of polishing, because the second resin layer 3 is formed continuously from the back face 1b of the substrate 1 to the cut surface (side face) 1a outlined upon the first dicing, for example, a polishing portion for polishing cannot touch the boundary closely adhering to the first resin layer 2 and the second resin layer 3. Therefore, there is no possibility of removing the second resin layer 3 covering the side face 1a by polishing.

Next, referring to FIG. 7-10, a semiconductor device C and a production method of the same in a second embodiment of the present invention is explained.

Figure 16:
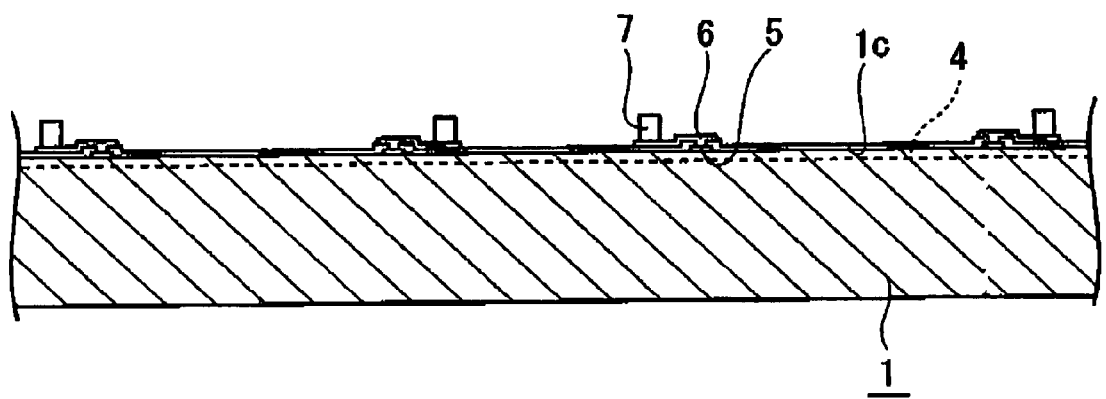
FIG. 16 shows a state of the semiconductor device production process of FIG. 15 in which the rewiring and the like are formed on the wafer.

As in the first embodiment shown in FIG. 16, the second embodiment of the present invention is mounted and used in devices such as, for example, a mobile terminal apparatus, and especially, is related to WL-CSP to which wafer level rewiring and resin moldings are processed. In this embodiment, the same symbols are applied and detailed explanations are omitted for the same structures and production methods of the semiconductor device B of the first embodiment.

Figure 7:
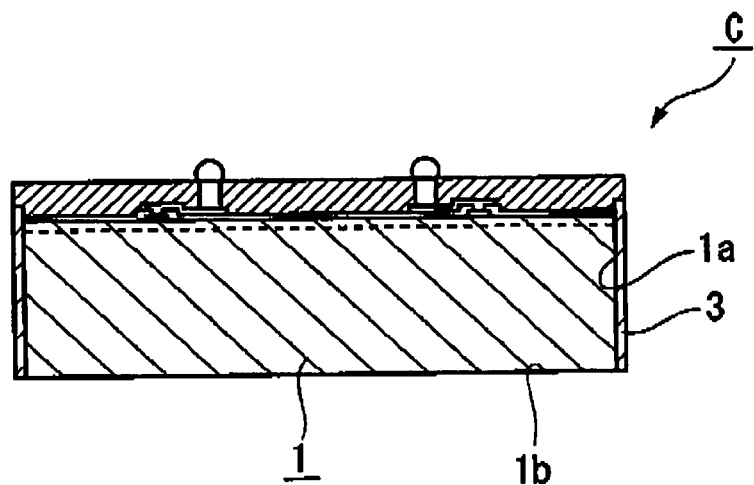
FIG. 7 is a cross-sectional view of the semiconductor device according to a second embodiment of the present invention.

Regarding the semiconductor device C of the second embodiment as shown in FIG. 7, different from the semiconductor device B described in the first embodiment, the second resin layer 3 is not formed on the back face 1b of the substrate 1. On the other hand, on the side face 1a of the substrate 1, the second resin layer 3 is formed and the side face 1a of the substrate 1 is covered and protected.

The production method of the above described semiconductor device C is explained referring to FIG. 2-4 and 7-9.

First, as in the first embodiment, the wafer 1 of the first embodiment on which the integrated circuit 4 is formed is prepared as shown in FIG. 2, and on the side of the principal face 1c of it, the rewiring 6 connected to the pad electrode 5 and the columnar metal post 7 embedded in the first resin layer 2 are formed.

In the next step, as shown in FIG. 3, the first dicing is processed from the back face 1b of the wafer 1 halfway to the first resin layer 2 and the cut line 10 is outlined. As shown in FIG. 4, by filling the outlined cut line 10 with the second resin layer and sealing the back face 1b of the wafer 1 with the second resin, the second resin layer 3 is formed.

Figure 8:
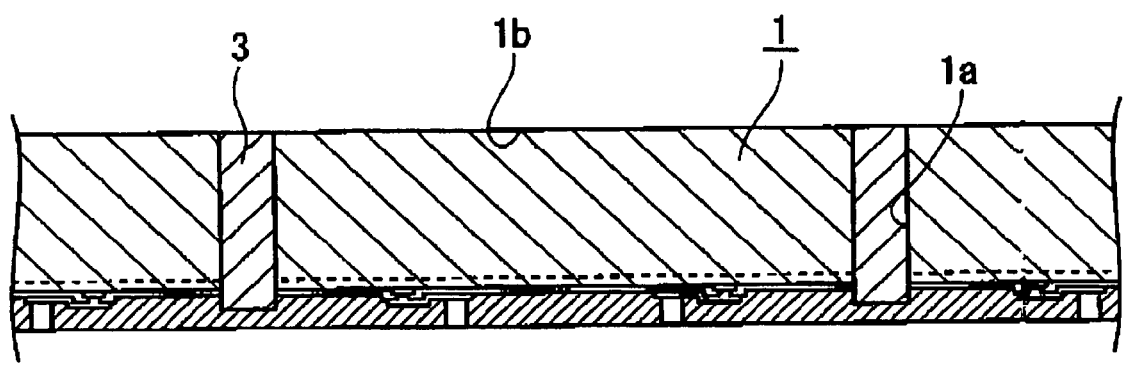
FIG. 8 shows a state of the semiconductor device production process of FIG. 7 in which the second resin layer on the back face of the wafer is removed.
Figure 9:
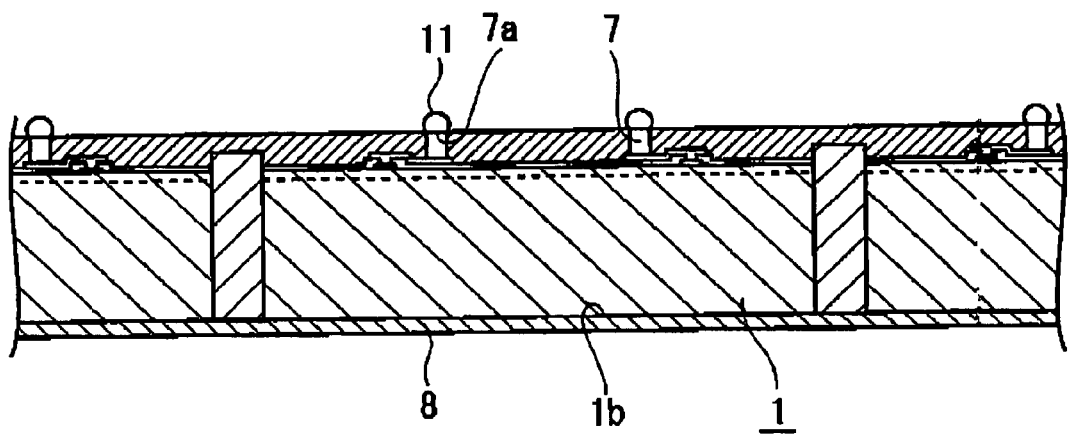
FIG. 9 shows a state of the semiconductor device production process of FIG. 7 in which the bump electrode is set and the dicing tape is adhered.

At the time after the resin is cured, as shown in FIG. 8, the second resin layer 3 on the back face 1b of the wafer 1 is removed by polishing and the back face 1b of the wafer 1 is exposed. At this time, the second resin is filled inside the cut line 10 therefore, the adherent between the cut face (the side face) 1a and the second resin is never removed by polishing and is strongly adhered. In the next step, as shown in FIG. 9, the bump 11 is mounted on the upper surface 7a of the columnar metal post 7 and the dicing tape 8 is adhered on the back face 1b of the wafer 1 that is exposed.

Figure 10:
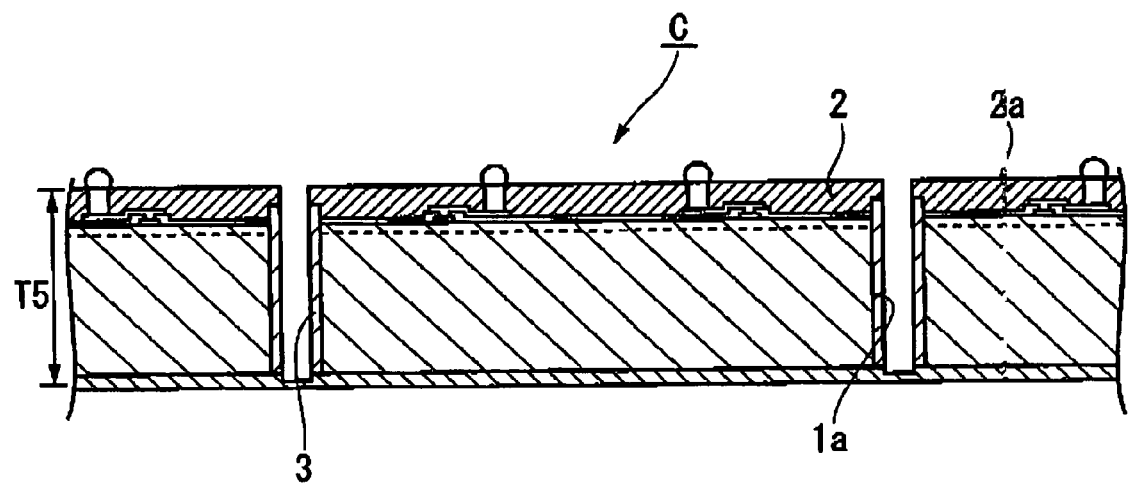
FIG. 10 shows a state of the semiconductor device production process of FIG. 7 in which the second dicing is processed.
Figure 11:
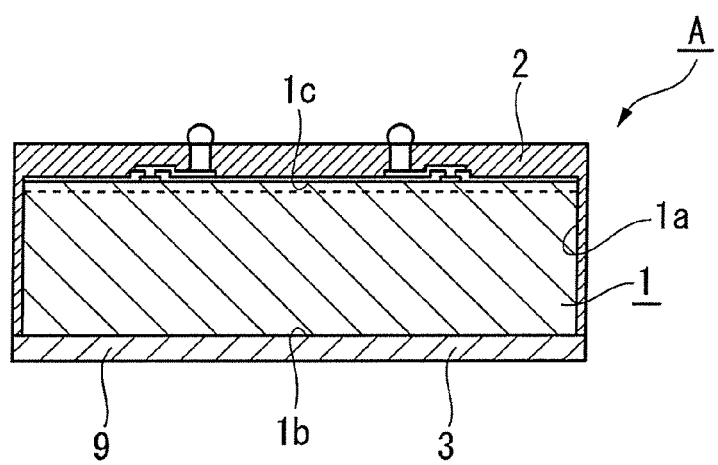
FIG. 11 is a cross-sectional view of a conventional semiconductor device.
Figure 12:
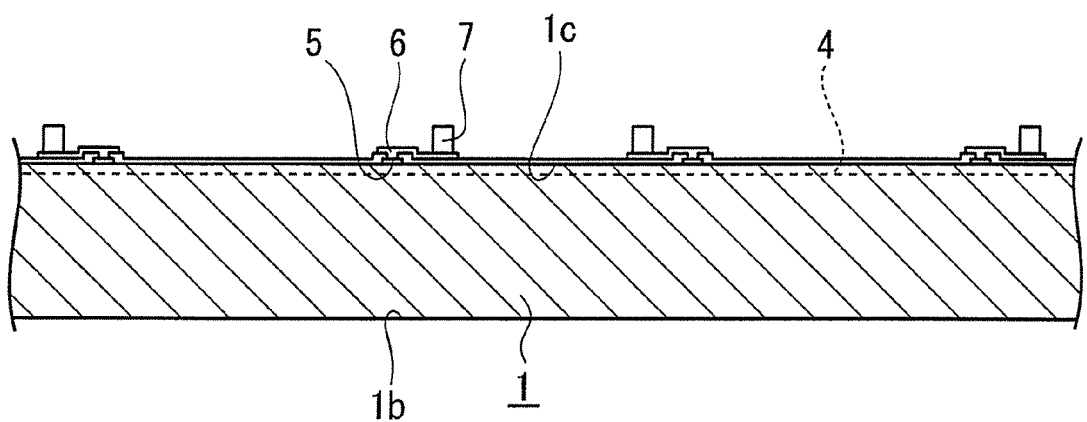
FIG. 12 shows a state of the semiconductor device production process of FIG. 11 in which the rewiring and the like are formed on the wafer.
Figure 13:
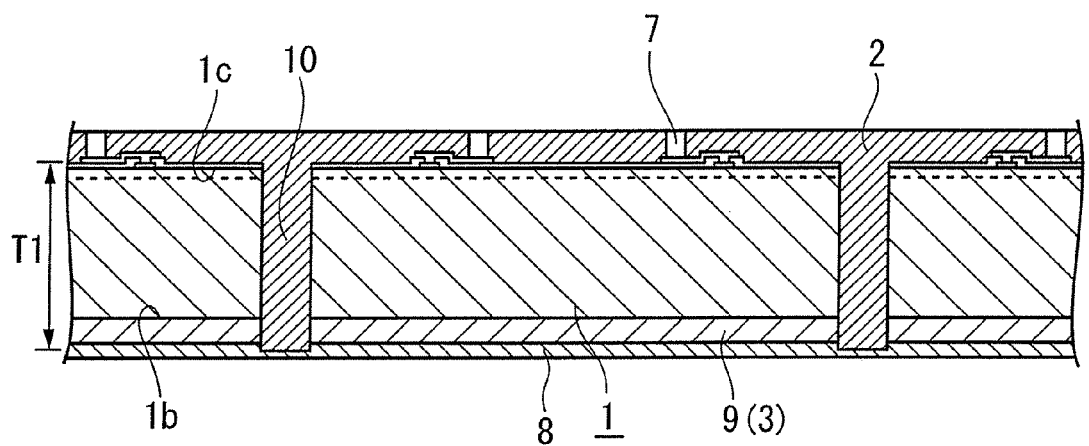
FIG. 13 shows a state of the semiconductor device production process of FIG. 11 in which the first resin layer is formed.
Figure 14:
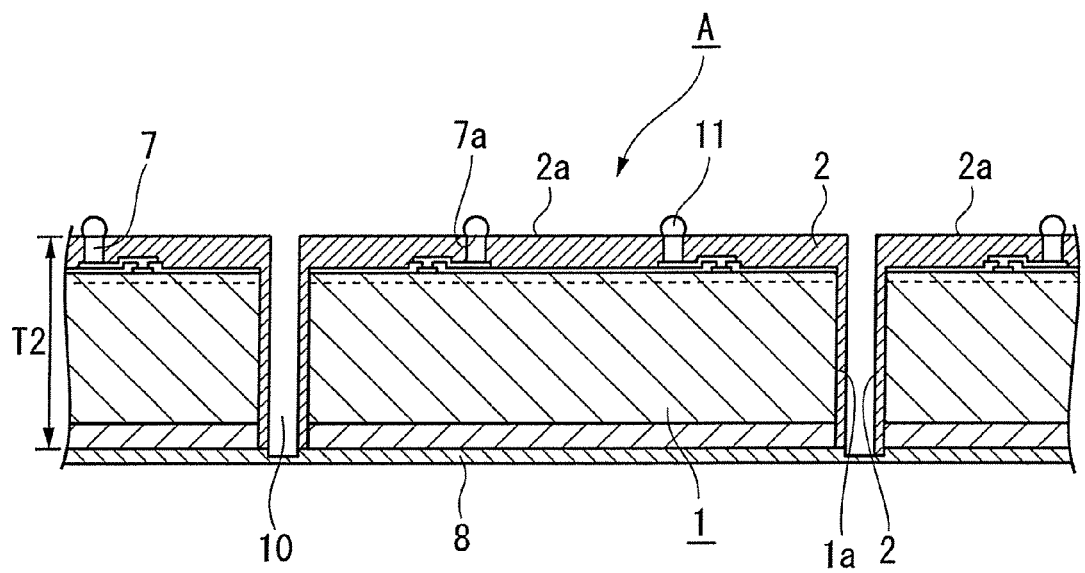
FIG. 14 shows a state of the semiconductor device production process of FIG. 11 in which the second dicing is processed.

In the next step, the second dicing is processed from the surface 2a of the first resin layer 2 while, as shown in FIG. 10, the second resin layer 3 is left in a state such as to cover the cut face (the side face 1a of the substrate 1) 1a outlined upon the fist dicing of the wafer 1. At this time, a dicing depth T5 is set to be halfway of the dicing tape 8. Finally, by removing the dicing tape 8, production of the diced semiconductor device C is finished.

Consequently, in accordance with the above described production method of the semiconductor device C, it is possible to design the semiconductor device C thinner by polishing the second resin layer 3 on the back face 1b of the wafer 1 while the cut line 10 outlined in the first dicing is in a state of being filled with the second resin inside. At this time, the second resin is cured in a state such that it fills inside the cut line 10, therefore, it is possible to prevent removal of the second resin by polishing from the cut face 1a of the wafer 1 formed at the first dicing, and it is possible to form the second resin layer 3 adhered strongly on the cut face 1a.

The present invention is not limited to the above described second embodiment, and it can be modified within the scope of it For example, in the second embodiment, the second resin layer 3 sealing the back face 1b of the wafer 1 is removed by polishing and the back face 1b is exposed, however, this is not a limitation and it is acceptable to design the semiconductor device C thinner by polishing the second resin layer 3 and maintaining the thickness along with reducing it. In this case, the second resin layer 3 is formed on the back face 1b of the substrate 1, therefore, the substrate 1 can be stronger and can be provided with shock resistance. Moreover, it is possible to design a much thinner semiconductor device C by polishing the substrate 1 itself in addition to the second resin layer 3 on the back face 1b of the wafer 1.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

Hereinafter, referring to FIG. 15-26, a semiconductor device B regarding a third embodiment of the present invention and a production method of the same is explained. The semiconductor device B of this embodiment is mounted and used on, for example, devices such as mobile terminal devices, and is especially related to WL-CSP to which wafer level rewirings and resin moldings are processed.

Figure 15:
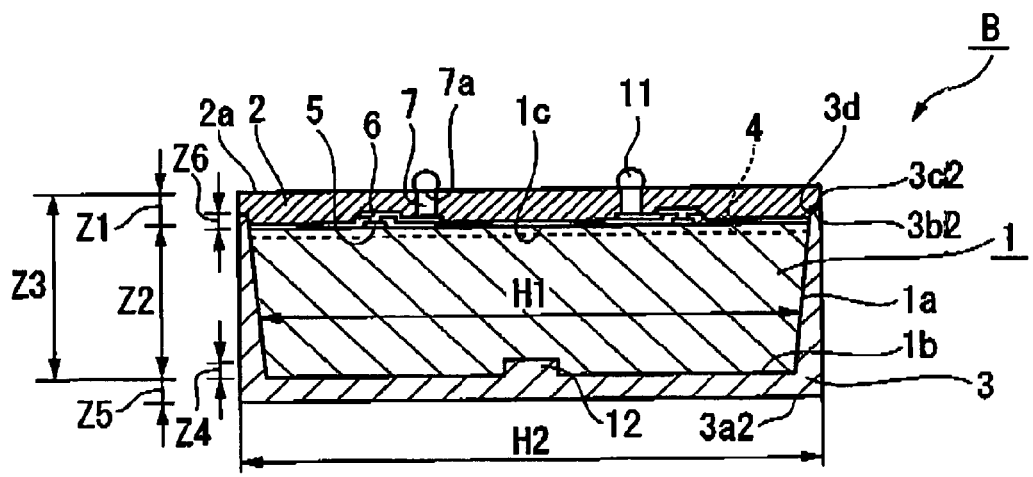
FIG. 15 is a cross-sectional view of the semiconductor device according to a third embodiment of the present invention.

The semiconductor device B of the present invention is, as shown in FIG. 15, the substrate (diced wafer) 1 which is laminate and which has the integrated circuit 4 on the principal face 1c, the rewiring 6 which is electrically connected to the integrated circuit 4 via the pad electrode 5, the electrode terminal (metal post) 7 which is pillar-shaped and formed on the rewiring 6, the first resin layer 2 which has a thickness from the principal face 1c of the substrate 1 to the upper face 7a of the electrode terminal 7 and which seals the principal face 1c of the substrate 1, and the bump electrode 11 (a bump) which is mounted on the upper surface 7a of the electrode terminal 7 that is exposed on the surface 2a of the first resin layer 2.

Regarding the semiconductor device B, the side face 1a (as described later, which is outlined in a first dicing) of the substrate 1 is formed in a taper-shape such that a width of the substrate 1 is gradually narrowed from the principal face 1c to the back face 1b, and on the back face 1b of the substrate 1, a slit portion 12 whose cross section forms a concave shape and which extends in a linear shape while seen in a plane facing the back face 1b of the substrate 1 at almost the center in a direction of a width H1. On the side face 1a and the back face 1b of the substrate 1, the second resin layer 3 is formed continuously and covers the side face 1a and the back face 1b including the inside of the slit portion 12 formed on the back face 1b. A width H2 of the semiconductor device B is formed in the same size in a direction from the surface 2a of the first resin layer 2 to a back face 3a2 of the second resin layer 3 parallel with the surface 2a, and therefore, it has a square shaped cross section except for the bump 11. In the second resin layer 3, an edge 3b2 set on a side of the principal face 1c of the substrate 1 is positioned in a range of Z1, which is a thickness of the first resin layer 2, and an edge 3c2 and the side face 3d of the substrate 1 are adhered closely to the first resin layer 2.

The first resin layer 2 and the second resin layer 3 are made from, for example, the same epoxy resin, and the bump 11 is coated with, for example, gold or solder. In this embodiment, a thickness Z2 of the substrate 1 is 200-500 μm and a thickness Z1 of the first resin layer 2 is 90 μm. A thickness Z3 of the substrate 1 plus the first resin layer 2 is 200-800 μm, preferably, it is 300-600 μm, and more preferably, it is 460 μm. On the other hand, regarding the slit portion 12, a depth Z4 from the back face 1b of the substrate 1 is formed to be more than 1 μm, and preferably, it is 1-100 μm. Regarding a depth Z5 of the second resin layer 3, it is formed to be approximately 10-400 μm, preferably, it is 100-200 μm, and more preferably, it is 140 μm. Moreover, regarding the edge 3b2 of the second resin layer 3 positioned in a range of the thickness Z1 of the first resin layer 2, a length Z6 from the principal face 1c of the substrate 1 to the edge 3c2 is 10-15 μm, and if the thickness Z2 of the substrate 1 is small, then it can be half.

In the next place, referring to FIG. 15-26, a production method of the semiconductor device B which has the above described structure is explained.

Figure 17:
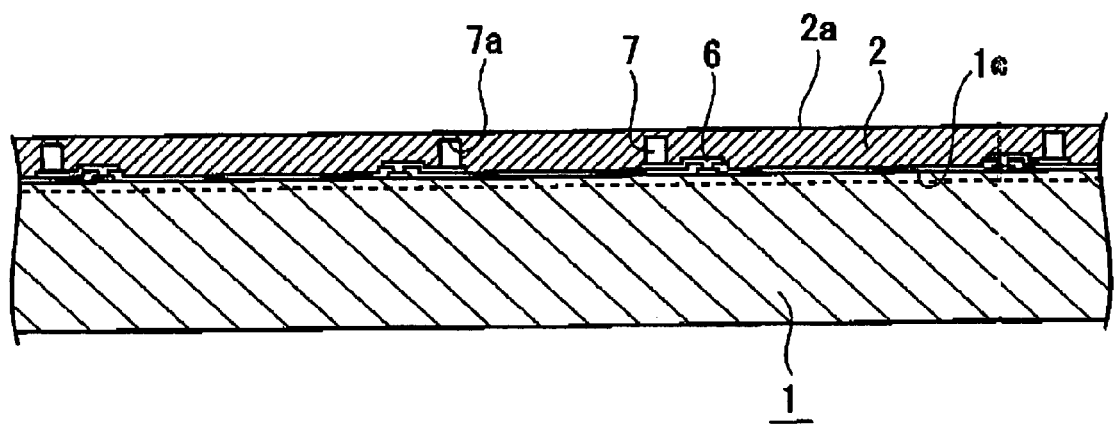
FIG. 17 shows a state of the semiconductor device production process of FIG. 15 in which a first resin layer is formed.
Figure 18:
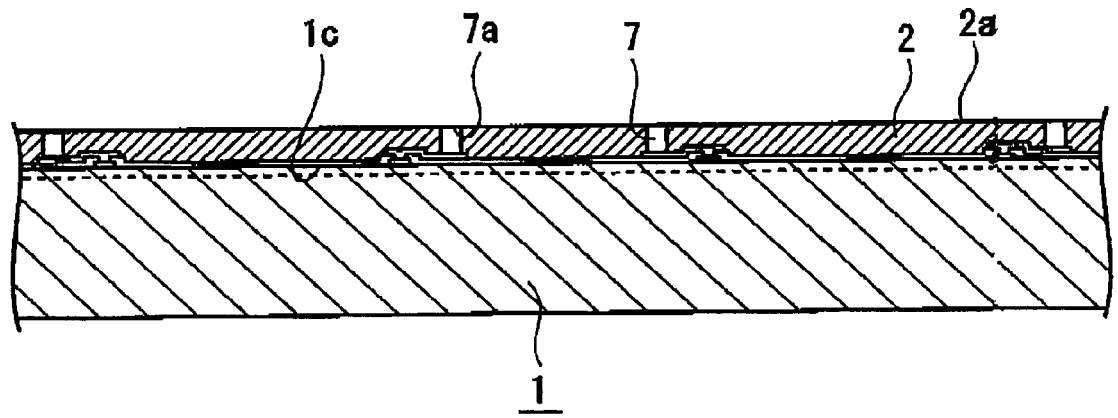
FIG. 18 shows in a semiconductor device production process of FIG. 15 in a state in which a surface of the first resin layer shown in FIG. 17 is polished and the electrode terminal is exposed.

First, as shown in FIG. 16, the wafer 1 is prepared which is in a disciform and on which the integrated circuit 4 is formed on the principal face, and the rewiring 6 connected to the pad electrode 5 and the pillar-shaped metal post 7 on rewiring 6 are formed. In this case, the rewiring 6 is etched while forming. As shown in FIG. 17, the rewiring 6 and the columnar metal post 7 are sealed with the first resin, and the first resin layer 2 is formed in a manner such that its upper face (surface) 2a is parallel to the principal face 1c of the wafer 1. In this step, the surface 2a of the first resin layer 2 is positioned upper to the upper face 7a of the columnar metal post 7, and the columnar metal post 7 is in a state of being embedded completely in the first resin layer 2. As shown in FIG. 18, the side of the surface 2a of the first resin layer 2 is polished while the surface 2a is kept parallel with the principal face 1c of the wafer 1, and the upper face 7a of the columnar metal post 7 is exposed on the surface 2a of the first resin layer 2.

Figure 19:
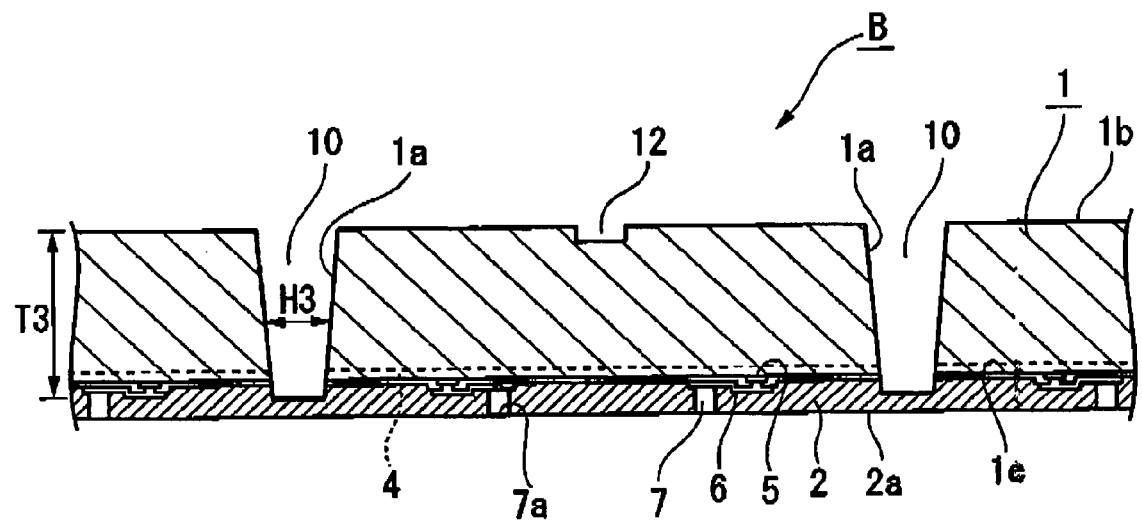
FIG. 19 shows in a semiconductor device production process of FIG. 15 a state in which a dicing cut line and a slit portion are formed.

Next, as shown in FIG. 19, the wafer 1 is turned upside down, and the first dicing is processed from the side of the back face 1b, using for example, a thin-bladed grindstone in accordance with the size of the semiconductor device B which is to be diced. In this step, the dicing depth T3 is halfway from the back face of the wafer 1 to the first resin layer 2, and in this first dicing, the dicing cut line 10 is outlined. This dicing cut line 10 is outlined so as to extend in a linear shape while seen in a plane facing the back face 1b of the wafer 1, for example, by rotating a ring-shaped thin-bladed grindstone at high speed while slitting into the back face 1b of the wafer 1 and moving it in an orthogonal direction to a line of axial rotation. By using a ring-shaped thin-bladed grindstone having an abrasive grain layer in which the size of thickness is gradually enlarged from the circumference to the inside, the side face 1a is formed in a taper-shape in which a width H3 is gradually enlarged from the surface 2a of the first resin layer 2 to the back face 1b of the wafer 1. In this case, at the step when the first dicing is finished, the first resin layer 2 is not completely cut and keeps enough thickness for maintaining strength, therefore, the wafer 1 which has the integrated circuit 4 and the rewiring 6 on the principal face 1c is supported by the first resin layer 2 as one unit, that is, it is not still diced. Therefore, it is possible to dice without slicing the wafer 1 upon the first dicing, and it can be expected to have no curving of the cut line.

At the step of finishing the first dicing, for example, the slit portion 12 is outlined which is almost median between neighboring dicing cut lines 10 and extends parallel to the direction of the dicing cut line 10 (a direction extending in a linear shape while seen as a plane facing to the back face 1b of the wafer 1), by dicing, for example, using the thin-bladed grindstone. In this case, the slit portion 12 extends from the back face 1b to the principal face 1c of the wafer 1 and is formed to have a depth shallower than the depth of the dicing cut line (dicing depth) T3 which extends from the back face 1b to the principal face 1c. In this step, the slit portion 12 is not limited to be formed by dicing with the thin-bladed grindstone, and it may be formed by, for example, sandblasting, laser dicing, etching or the like.

Figure 20:
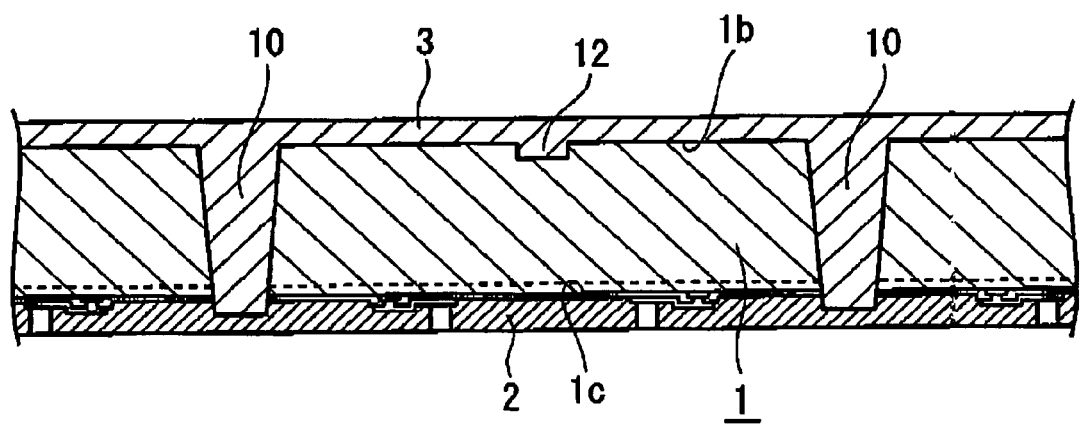
FIG. 20 shows in a semiconductor device production process of FIG. 15 a state of sealing with a second resin.
Figure 23:
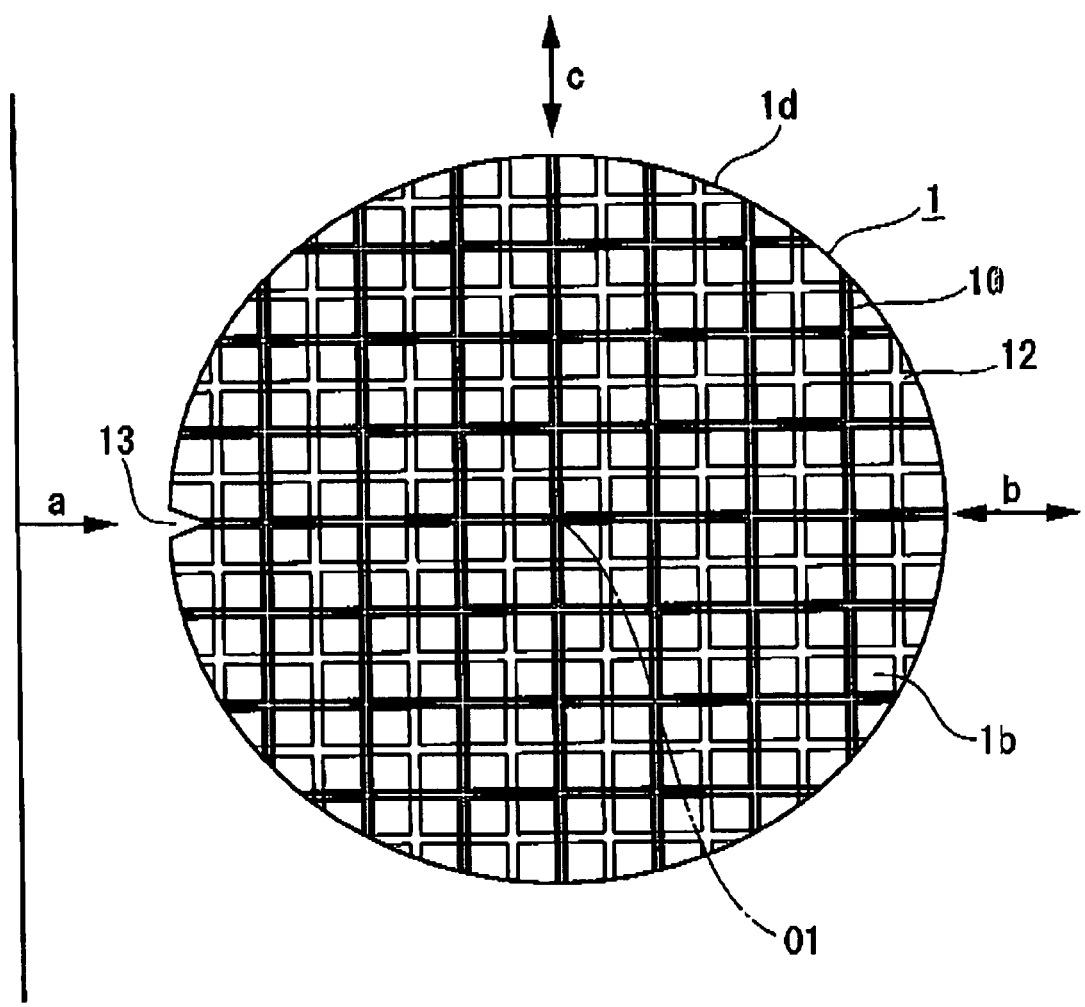
FIG. 23 is a figure shows a state before modifying the wafer to a printing direction for printing the second resin.
Figure 24:
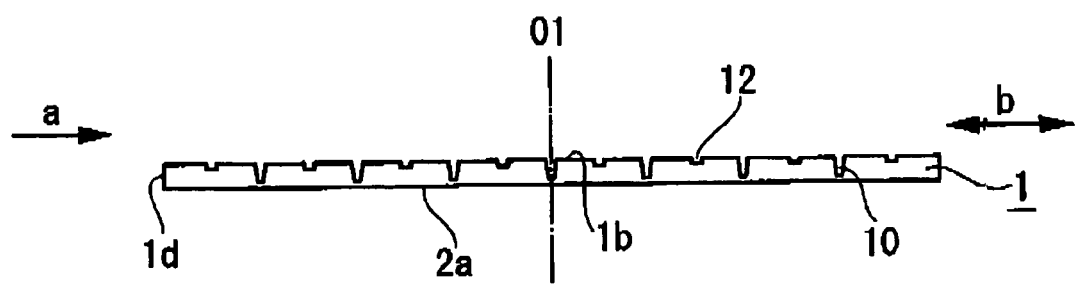
FIG. 24 is a side view of FIG. 23.
Figure 25:
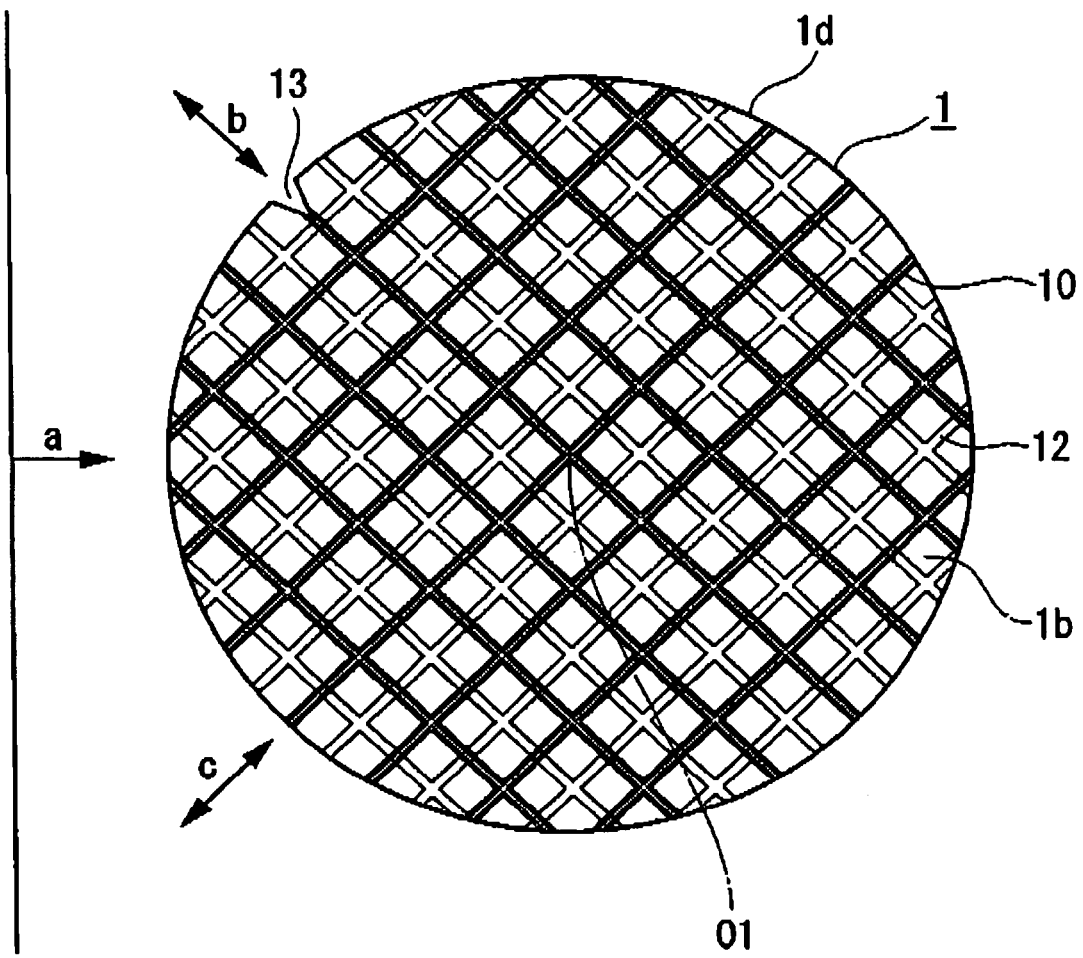
FIG. 25 is a figure shows a state after modifying the wafer to a printing direction for printing the second resin.
Figure 26:
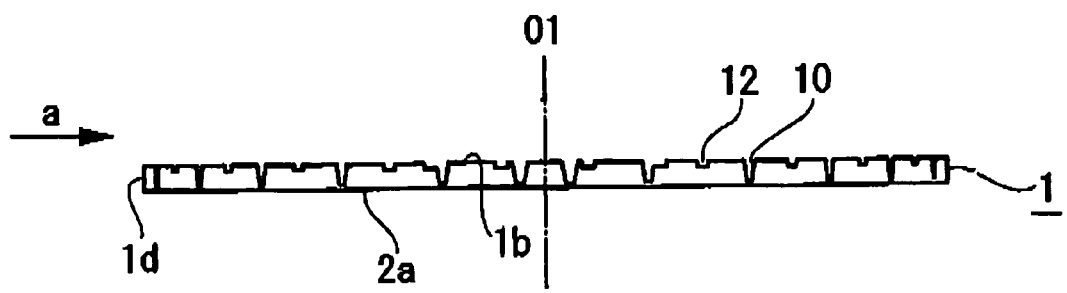
FIG. 26 is a side view of FIG. 25.

As shown in FIG. 20, the second resin layer 3 is formed by, for example, printing the second resin with the stage moving on the principal face 1c while keeping a certain height from the principal face 1c of the wafer 1, filling the outlined dicing cut line 10 and the slit portion 12 with the second resin, and sealing the side of the back face 1b of the wafer 1. In this step, as shown in FIG. 23 and FIG. 24, if the second resin is printed in a direction (in a case of printing in a direction of an arrow a) which is orthogonal or parallel to the direction to which the dicing cut line 10 and the slit portion 12 extend (direction of an arrow b and an arrow c), air is easily included when the second resin comes inside the dicing cut line 10 and the slit portion 12. Therefore, in this embodiment, upon printing the second resin, the position of the wafer 1 is changed by rotating the wafer 1 around the axis line O1 with a rotation angle of 45 degrees in reference to a notch 13 (a mark to detect the position of the wafer 1) which has a V-shaped cross section and is provided on the side of a perimeter 1d of the disciform wafer 1 as shown in FIG. 23. FIG. 25 and 26 show a status of rotating the wafer 1 in such manner, and in this embodiment, the second resin is printed in a direction crossing the extending direction of the dicing cut line 10 and the slit portion 12 at an angle of, for example, 45 degrees. Therefore, the second resin flows into the dicing cut line 10 and the slit portion 12, is filled in a state of reducing the flow resistance at a lower level and in a state of flowing by extrusion, and does not include air inside. In this case, upon printing the second resin, the direction of printing should cross the extending direction of the dicing cut line 10, therefore, it can be, for example, from 15 degrees to 75 degrees, and preferably it is 45 degrees in terms of filling equally the dicing cut line 10 and the slit portion 12. In this process, the wafer 1 is rotated at a corresponding angle.

Figure 21:
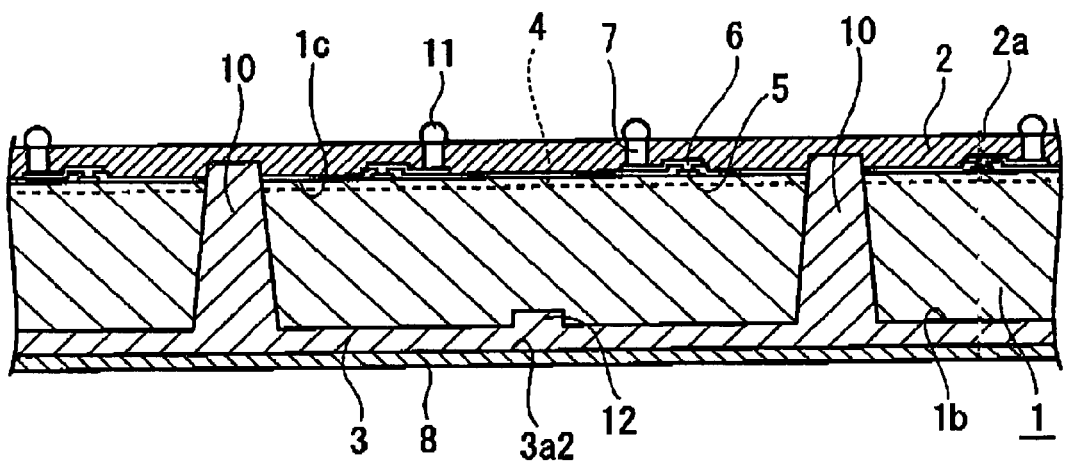
FIG. 21 shows in a semiconductor device production process of FIG. 15 a state in which a bump electrode is set and a dicing tape is adhered.

When the second resin is cured, the wafer 1 is turned upside down, and as shown in FIG. 21, the bump 11 is mounted on the upper face 7a of the columnar metal post 7 exposed on the surface 2a of the first resin layer 2, and the dicing tape 8 is adhered on the back face 3a2 of the second resin layer 3 sealing the back face 1b of the wafer 1.

Figure 22:
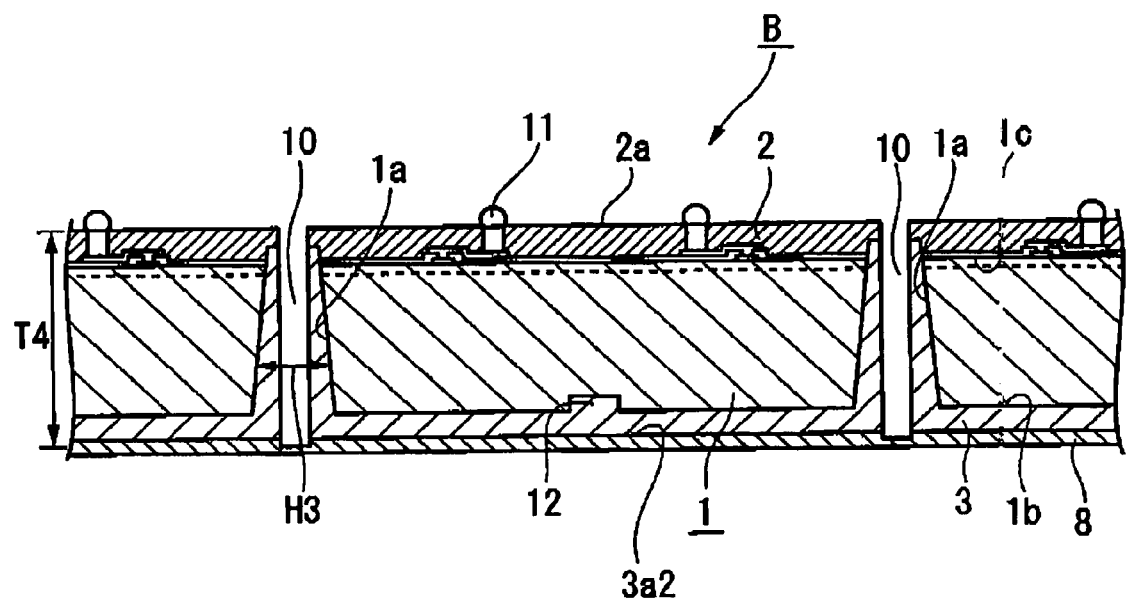
FIG. 22 shows in a semiconductor device production process of FIG. 15 a state in which a second dicing is performed.

As shown in FIG. 22, a thin-bladed grindstone which is thinner than the thin-bladed grindstone used for outlining the dicing cut line 10 is prepared, and the second dicing is operated from the side of the surface 2a of the first resin layer 2 at a center portion in a direction of the width H3 of the dicing cut line 10 while the second resin layer 3 remains in a state of covering the cut face 1a (the side face 1a of the substrate 1) of the first dicing. The dicing depth T4 is halfway from the surface 2a of the first resin layer 2 to the dicing tape 8, and in this step, the semiconductor device B is diced. Upon the second dicing, a cutting load for dicing the first resin layer 2 and the second resin layer 3 is small. Therefore, it can prevent curving of the cut line if the dicing is processed in a state of supporting the wafer 1 with the dicing tape 8.

Finally, the dicing tape 8 is pulled so as to stretch it, and the semiconductor device B which is in a state of sticking to the dicing tape S and diced is removed. The production process of the semiconductor device B shown in FIG. 15 is finished.

Therefore, in accordance with the above described semiconductor device B and the production method of the same, by forming the slit portion 12 on the back face 1b of the substrate 1 (diced wafer) and forming the second resin layer 3 while filling the second resin into the slit portion 12, it is possible to gain an adhesion area and resistance for modifications of the second resin layer 3, therefore, it is possible to adhere the substrate 1 and the second resin layer 3 strongly and it is possible to reduce the possibility of removing the second resin layer 3. By forming the side face 1a of the substrate 1 in a taper-shape, compared to the conventional semiconductor device A in which the side face 1a crosses orthogonally to the back face 1b of the substrate, it is possible to gain the adhesion areas, therefore, it is possible to reduce the possibility of removing the second resin layer 3.

The second resin layer 3 covering the side face 1a and the back face 1b of the substrate 1 is formed continuously, however, the second resin layer covering the principal face 1c and the first resin layer 2 are not formed continuously, therefore, even if the second resin layer 3 covering the side face 1a is removed, it is possible to prevent the possibility of removing the first resin layer. Therefore, it is possible to prevent damage to the integrated circuit 4 formed on the principal face of the substrate 1 due to removal of the resin layer.

Upon printing the second resin, by printing at an angle of 45 degrees to the extending direction of the dicing cut line 10 and the slit portion 12, it is possible to fill the resin in a state of flowing by extrusion and to reduce the flow resistance at a lower level. That is, upon filling the second resin, it is possible to prevent including air and to form the second resin layer 3 densely and thickly, therefore, it is possible to reliably strengthen the substrate 1.

The present invention is not limited to the above described third embodiment, and it can be modified within the scope of it. For example, in this embodiments the first dicing and forming of the slit portion 12 are operated after forming the first resin layer 2, however, it is possible to be operated before any one phase of sealing the rewiring 6 and the columnar metal post 7 with the first resin, polishing the first resin layer 2 in order to expose the upper fce 7a of the columnar metal post 7, or mounting the bump 11 on the columnar metal post 7. Upon printing the second resin, it is explained that the direction of printing crosses the extending direction of the dicing cut line 10 and the slit portion 12 at an angle of 45 degrees, however, it can be printed, for example, from 15 degrees to 75 degrees to the extending direction and the same advantage can be obtained in this case too. It is explained that the dicing cut line extends in a linear shape while seen in a plane facing the back face 1b of the wafer 1, however, it can be extended in a curved line shape.

In this embodiment, it is explained that the slit portion 12 has a square shaped cross section and is almost median between neighboring dicing cut lines 10 and extends parallel to the direction of the dicing cut line 10, however, the slit portion 12 is not limited to have a square shaped cross section and can have a curved shape. Moreover, it is not limited to be almost median between neighboring dicing cut lines 10 and to extend parallel to the direction of the dicing cut line 10. Therefore, the slit portion 12 is not limited in its shape or its position except for being formed in a concave shape on the back face 1b of the substrate 1. Moreover, in this embodiment, the side face 1a of the substrate 1 outlined with the dicing cut line 10 is in a taper-shape, however, the shape of the side face 1a (a side face outlined upon the first dicing) of the substrate is not required to have a limitation. Moreover, in this embodiment, the slit portion 12 is in a linear shape, however, it is also preferable that, for example, it is a multiple linear shape and is set and formed to divide the dicing cut line 10 equally by each line.

Moreover, it is explained that the second resin layer 3 is the same epoxy resin as the first resin layer 2, however, the resin of these two layers can have different characteristics such as, for example, different content of the filler, or can be a different resin from the epoxy resin. Moreover, it is described that the dicing depth T3 of the first dicing is halfway of the first resin layer 2, however, the dicing depth T3 of the first dicing can reach the principal face 1c of the wafer 1 and in this case, the edge 3b2 of the second resin layer 3 adhered closely to the first resin layer 2 is adhered to the first resin layer 2 only with the edge face 3c2. It is also preferable to polish the second resin layer 3 formed on the back face 1b of the wafer 1 while being left in a state of sealing the back face 1b of the wafer 1. In this case, the thickness Z4 of the second resin layer 3 shown in FIG. 19 decreases and it is possible to design a thinner semiconductor device B while increasing the strength of the back face 1b of the wafer 1 with the second resin layer 3.

Figure 30:
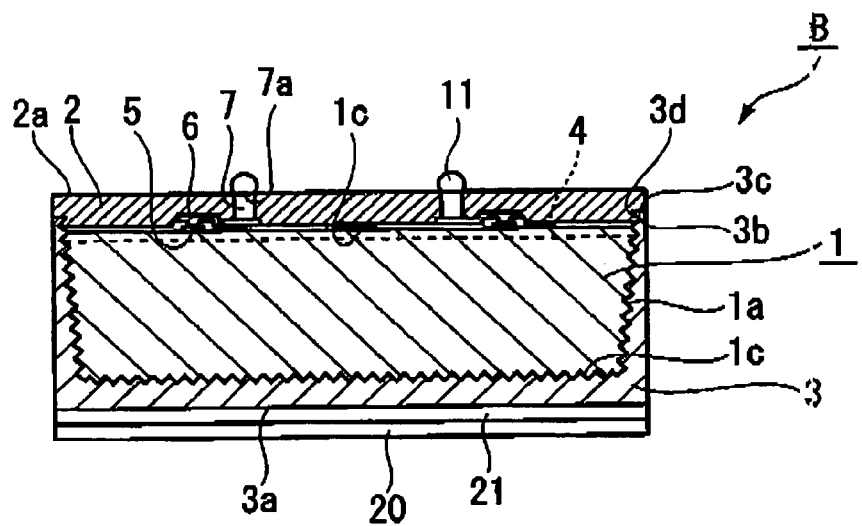
FIG. 30 shows the semiconductor device to which a surface treatment is operated in a production step.

In the embodiments above, it is explained that the second resin layer 3 is printed after forming the dicing cut line 10. However, It is appropriate that after forming the dicing cut line 10, a surface treatment is operated on the side opposite to the first resin layer 2 of the wafer 1. It is appropriate to operate the surface treatment on the back face 1b of the wafer 1 and/or the inside surface of the dicing cut line 10 (see FIG. 30). It should be noted that in FIG. 30-32, the treated surfaces are drawn roughly for easy understanding. The roughness of the treated surfaces in these figures is not accurate to the real roughness. By operating such surface treatment, it is possible to increase adherence between the first resin layer 2 and the second resin layer 3 even if the slit portion 12 is omitted.

In this surface treatment, it is possible to increase adherence with the second resin layer 3 by discharging water mixed with an abrasive (for example, sand, glass powder, metal pieces, plastic pieces and the like) into the back face 1b of the wafer 1 in order to roughen its surface, and by adjusting the roughness of the surface Ra (arithmetic mean roughness) to be 10-100 μm. It is appropriate that this surface treatment is a sandblast method.

Figure 31:
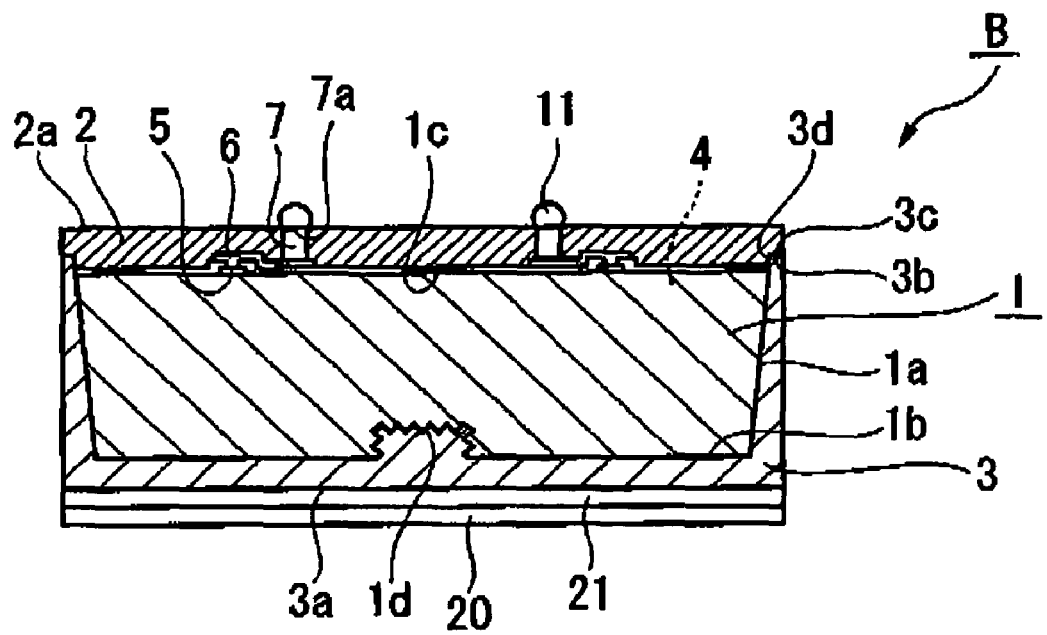
FIG. 31 shows the semiconductor device to which a surface treatment is operated in a production step.
Figure 32:
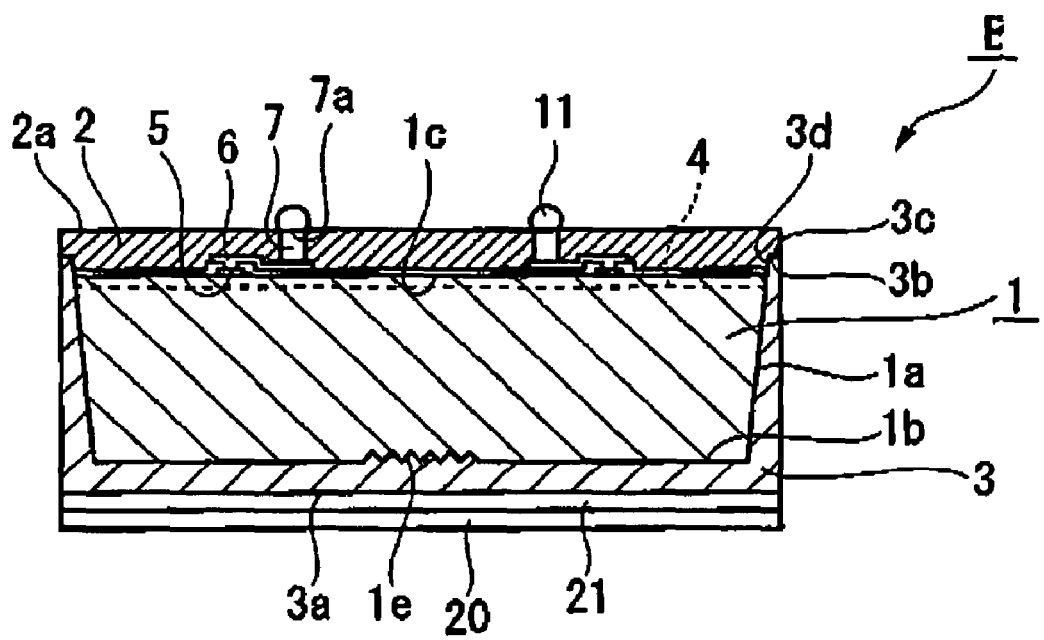
FIG. 32 shows the semiconductor device to which a surface treatment is operated in a production step.

It is appropriate to operate the surface treatment only on the inside surface 1d of the slit portion 12 (see FIG. 31). It increases adherence with the second resin layer 3.

It is appropriate to operate the surface treatment only on the surface 1e it at the same position as the slit portion 12 (see FIG. 32) even when the slit portion 12 is not formed. It increases adherence with the second resin layer 3.

It is appropriate to operate the surface treatment by discharging air, water, or both air and water. However, upon operating the surface treatment by discharging air without water, there is a possibility that the static electricity is generated because of using the plastic therefore it is preferable to use other abrasive.

Figure 27:
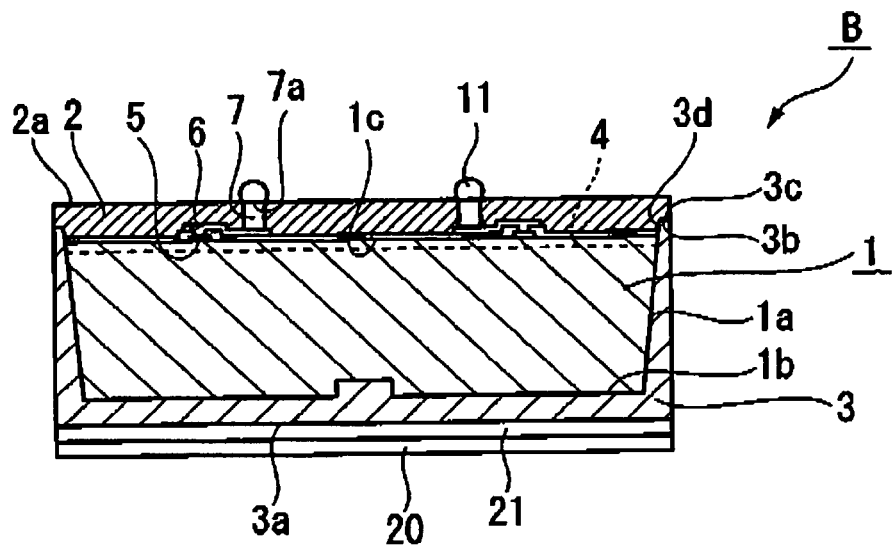
FIG. 27 is a cross-sectional view shown as an example of variation of the semiconductor device of one embodiment in the present invention.
Figure 28:
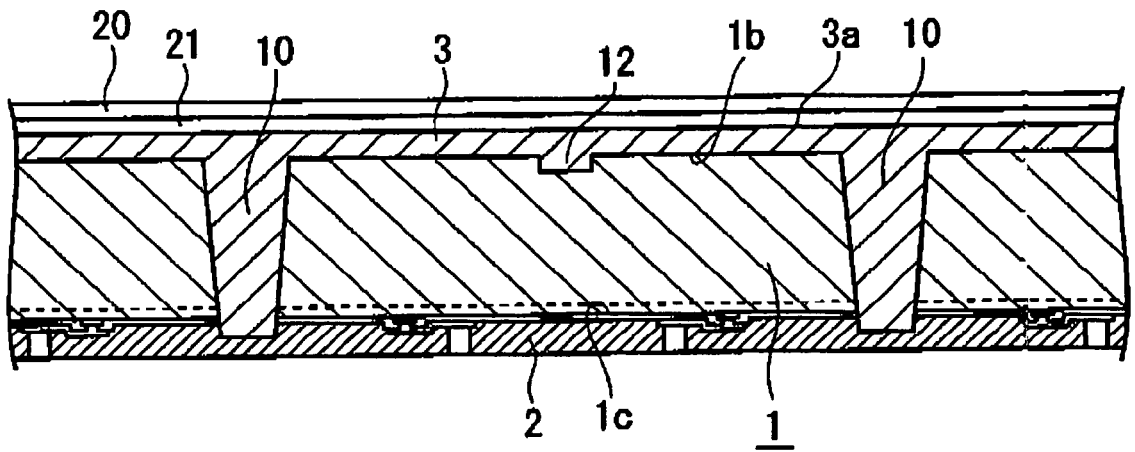
FIG. 28 shows a state in a production step of the wafer of FIG. 27 in which the radiation plate is adhered before the second dicing.

Moreover, in the above described embodiments, the back face 3a of the second resin layer 3 forms an external face (upper surface) of the semiconductor device B, however, it is appropriate that, for example as shown in FIG. 27, a radiator plate (metal layer) 20 is provided on the back face 3a of the second resin layer 3 (on the second resin layer 3) and the external surface of this radiator plate 20 forms the upper face of the semiconductor device B. In this case, as shown in FIG. 28, after forming the second resin layer 3, the radiator plate 20 is adhered on the back face 3a of the second resin layer 3 with an adhesive 21. This radiator plate 20 can be, for example, a metal plate made from copper (Cu), aluminum (Al), titanium (Ti), nickel (Ni) and the like with thickness among 50 to 500 μm and if a Cu plate is applied, then it is appropriate to coat with Ni for preventing a corrosive. It is recommended to use the adhesive made from silicon or epoxy mixed with a heat conductive additive such as a metal powder like powdered silver (Ag), powdered Cu or powdered Ni, or silicon dioxide (SiO2).

It is appropriate that this adhesive 21 is a liquid adhesive printed with thickness among, for example, 20-500 μm, or a sheet adhesive with the same thickness and is hardened by heat and/or pressure to adhere the radiator plate 20 and the second resin layer 3.

Figure 29:
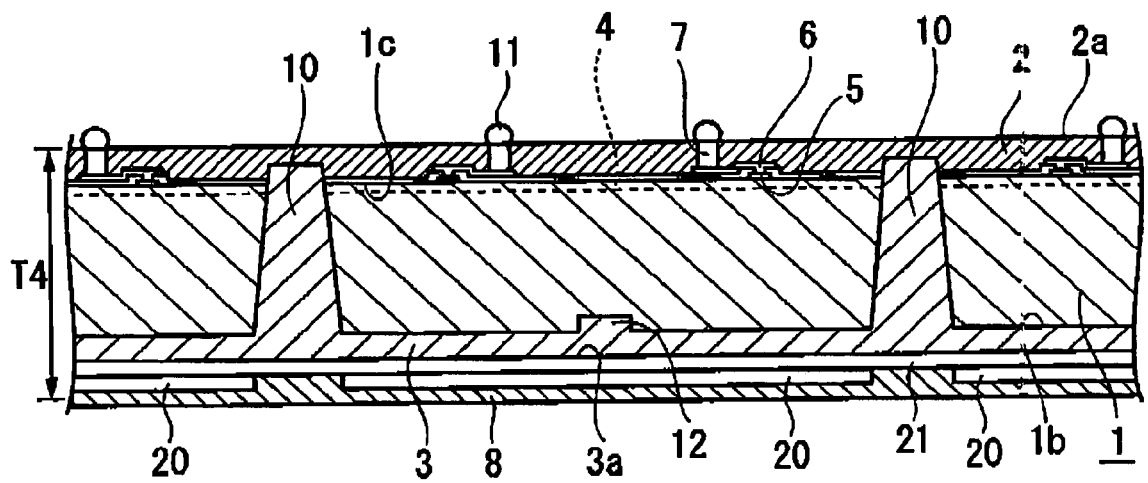
FIG. 29 shows a state in a production step of the wafer of FIG. 27 in which the diced radiation plate and the dicing tape are adhered before the second dicing.

Moreover, as shown in FIG. 29, it is appropriate that the radiator plate 20 deiced beforehand is adhered to the back face 3a of the second resin layer 3. In a case as described above that the radiator plate 20 is provided via the adhesive 21, the dicing tape 8 is fixed on the external surface of the radiator plate 20 when the radiator plate 20 is adhered, and the following steps are same as the embodiments above. In this case, the dicing depth T4 is adapted to be halfway to the dicing tape 8 from the surface 2a of the first resin layer 2, and it is needed to increase the dicing depth T4 as same as the radiator plate 20.

As described above, the diced semiconductor device B is formed with the radiator plate 20 on the external face (upper surface), therefore, it is possible to radiate heat of the semiconductor device 20 to the outside, that is, it is excellently radiate, and it is possible to produce the semiconductor device B with high reliability.

What is claimed is:

1. A semiconductor device production method comprising the steps of:
    preparing a wafer on which a plurality of integrated circuits are formed on a principal face;
    forming a rewiring which is electrically connected to the integrated circuits via a pad electrode;
    forming an electrode terminal on the rewiring;
    forming a first resin layer by sealing at least the rewiring and the electrode terminal formed on the principal face of the wafer with a first resin;
    processing a first dicing from a side of a back face of the wafer to the principal face of the wafer or halfway to the first resin layer when the first resin layer is formed;
    forming a second resin layer by sealing a cut line outlined upon the first dicing and the back face of the wafer continuously with a second resin; and
    processing a second dicing while leaving the second resin layer which covers a side face outlined upon the first dicing.

2. The semiconductor device production method according to claim 1, further comprising the step of:
    polishing the second resin layer which seals the back face of the wafer in order to expose the wafer.

3. A semiconductor device production method comprising the steps of:
    preparing a wafer on which a plurality of integrated circuits are formed on a principal face;
    forming a rewiring which is electrically connected to the integrated circuits via a pad electrode;
    forming an electrode terminal on the rewiring;
    forming a first resin layer;
    forming a dicing cut line by processing a first dicing from a back face of the wafer to the principal face of the wafer or halfway to the first resin layer when the first resin layer is formed;
    forming a slit portion whose cross section is in a concave shape and that extends in a direction from the back face to the principal face and that has a depth smaller than a depth of the dicing cut line which extends in a direction from the back face to the principal face;
    forming a second resin layer by sealing a cut line outlined upon the first dicing and the back face of the wafer continuously with a second resin; and
    processing a second dicing while leaving the second resin layer which covers a side face outlined upon the first dicing.

4. A semiconductor device production method comprising the steps of:
    preparing a wafer on which a plurality of integrated circuits are formed on a principal face;
    forming a rewiring which is electrically connected to the integrated circuits via a pad electrode;
    sealing at least the rewiring and the electrode terminal formed on the principal face of the wafer in an embedded state with a first resin after forming an electrode terminal on the rewiring;
    forming the first resin layer while polishing the first resin in order to expose the electrode terminal;
    mounting a bump electrode on the electrode terminal which is exposed in order to connect the semiconductor device to outside; and
    dicing the wafer, comprising the steps of:
    forming a dicing cut line by processing a first dicing from a back face of the wafer to the principal face of the wafer or halfway to the first resin layer when the rewiring and the electrode terminal are sealed with the first resin, when the first resin layer is formed, or when the bump electrode is mounted on the electrode terminal;
    forming a slit portion whose cross section is in a concave shape and that extends in a direction from the back face to the principal face and that has a depth smaller than a depth of the dicing cut line which extends in a direction from the back face to the principal face;
    forming a second resin layer by sealing a cut line outlined upon the first dicing and the back face of the wafer continuously with a second resin; and
    processing a second dicing while leaving the second resin layer which covers a side face outlined upon the first dicing.

5. The semiconductor device production method according to claim 3, wherein:
    the first dicing is operated in a manner in which the dicing cut line is extended in a linear shape while seen in a plane facing the back face; and
    upon forming the second resin layer, the second resin is printed in a direction crossing a direction in which the dicing cut line is extended.

6. The semiconductor device production method according to claim 5, wherein:
    the second resin is printed in a direction crossing an extending direction of the dicing cut line at an angle from 15 degrees to 75 degrees.

7. The semiconductor device production method according to claim 3, wherein:
    the second resin layer is polished while the second resin layer is left on the back face of the wafer in a state of sealing the back face of the wafer.

8. The semiconductor device production method according to claim 1, further comprising a step of:
    adhering a metal plate after forming the second resin layer and before the second dicing.

9. The semiconductor device production method according to claim 1, further comprising a step of:
    roughening both or one of the principle surface of the wafer and surface of the first resin layer after the first dicing.

10. A semiconductor device, comprising:
    an integrated circuit on a principal face of a substrate;
    a rewiring electrically connected to the integrated circuit via a pad electrode;
    a first resin layer which has a thickness from the principal face of the substrate to an upper surface of the electrode terminal and which seals a side of the principal face of the substrate; and
    a bump electrode mounted on the upper surface of the electrode terminal which is exposed on upper surface of the first resin layer, wherein:
    a slit portion is formed on a back face of the substrate and whose cross section is in a concave shape and that extends in a direction from the back face to the principal face; and
    a second resin layer is formed to cover the back face and the side face crossing the back face continuously while being filled in the slit portion.

* * * * *